(12) United States Patent
Mizutani

(10) Patent No.: US 10,743,403 B2
(45) Date of Patent: Aug. 11, 2020

(54) WIRING BOARD

(71) Applicant: SHINKO ELECTRIC INDUSTRIES CO., LTD., Nagano (JP)

(72) Inventor: Rie Mizutani, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 0 days.

(21) Appl. No.: 16/714,905

(22) Filed: Dec. 16, 2019

(65) Prior Publication Data

US 2020/0214122 A1     Jul. 2, 2020

(30) Foreign Application Priority Data

Dec. 28, 2018   (JP) .................................. 2018-248131

(51) Int. Cl.
*H05K 1/02* (2006.01)
*H05K 1/11* (2006.01)

(52) U.S. Cl.
CPC .......... *H05K 1/0213* (2013.01); *H05K 1/112* (2013.01)

(58) Field of Classification Search
CPC ......... H05K 1/0213; H05K 1/112; H05K 1/02
USPC ........................................................... 174/250
See application file for complete search history.

(56) References Cited

U.S. PATENT DOCUMENTS 9,711,439 B2     7/2017  Sakamoto et al.

FOREIGN PATENT DOCUMENTS

JP      2016-051834    4/2016

*Primary Examiner* — Tremesha S Willis
(74) *Attorney, Agent, or Firm* — IPUSA, PLLC

(57) ABSTRACT

A wiring board includes an insulating layer, and a metal layer. The insulating layer includes a first pattern and a second pattern. The first pattern includes first grooves extending parallel to each other, and a first projecting part separating adjacent first grooves. The second pattern includes a second projecting part, and a second groove surrounding the second projecting part. The metal layer includes a wiring formed within the first grooves, and a degassing hole formed within the second pattern and having an opening formed by the second projecting part.

13 Claims, 26 Drawing Sheets

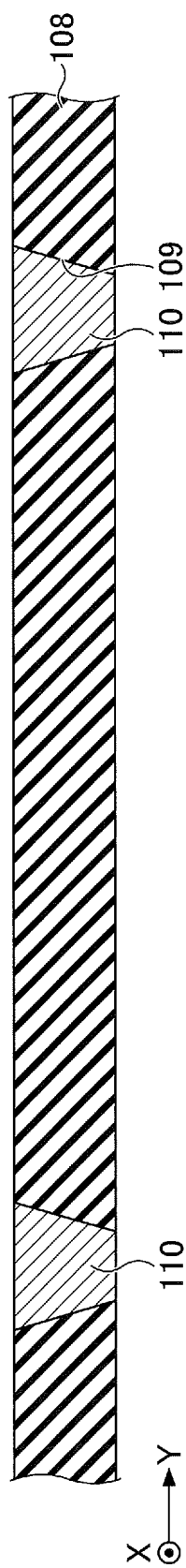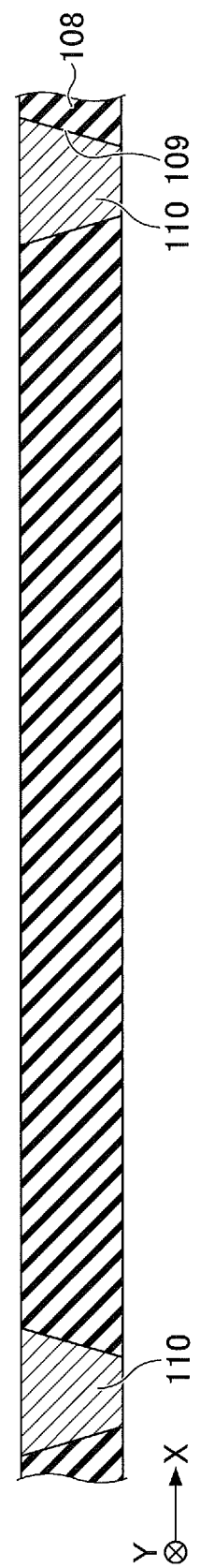

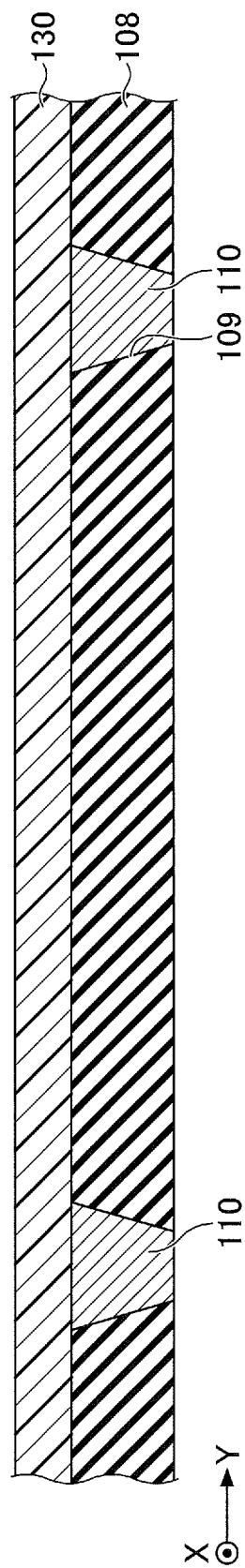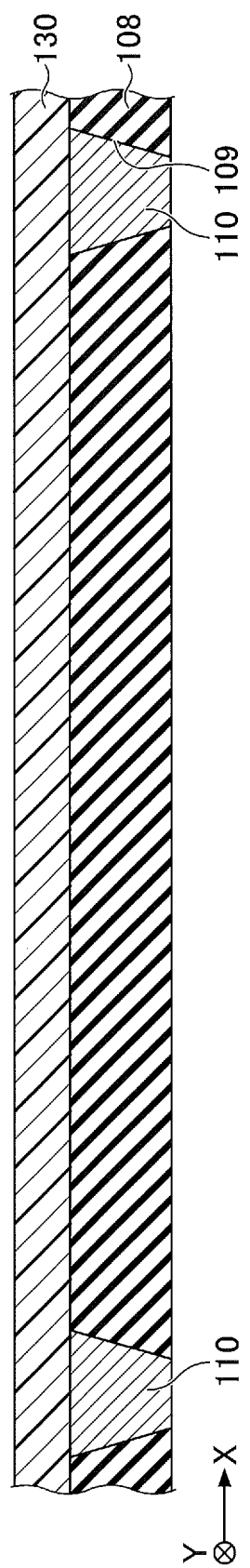

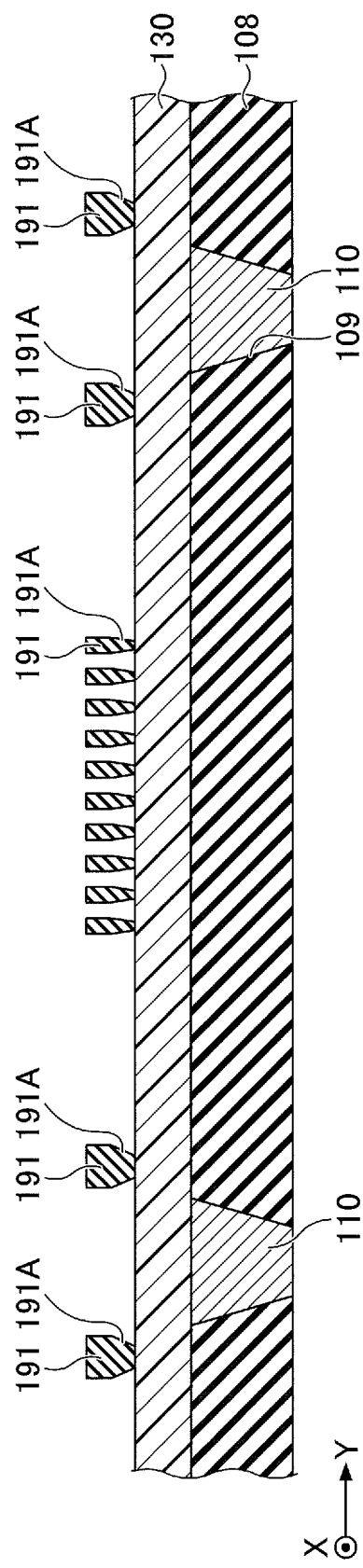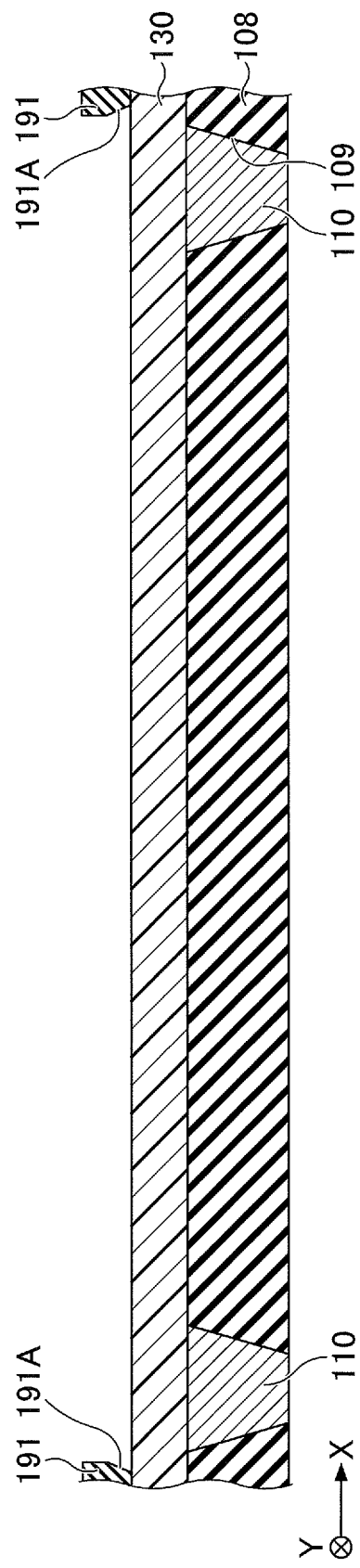

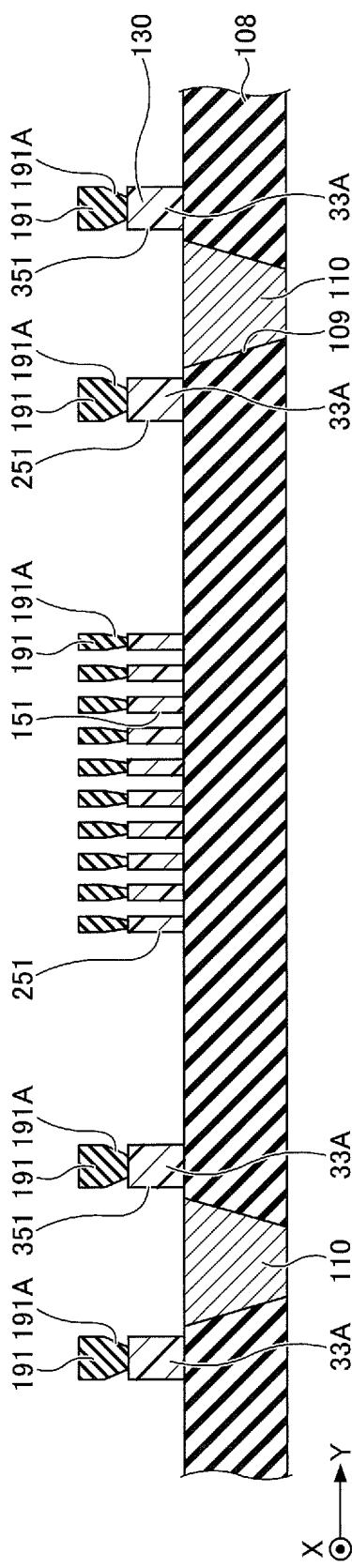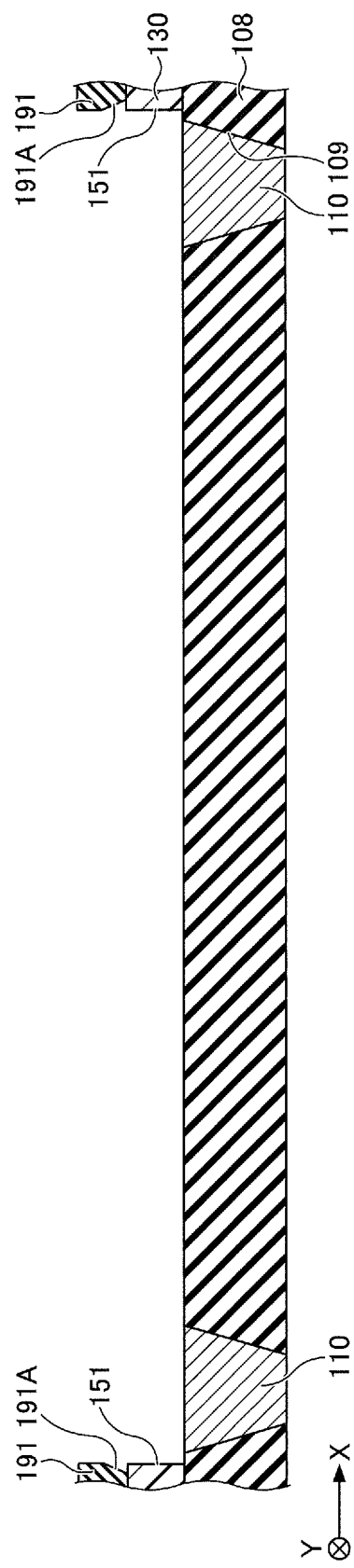

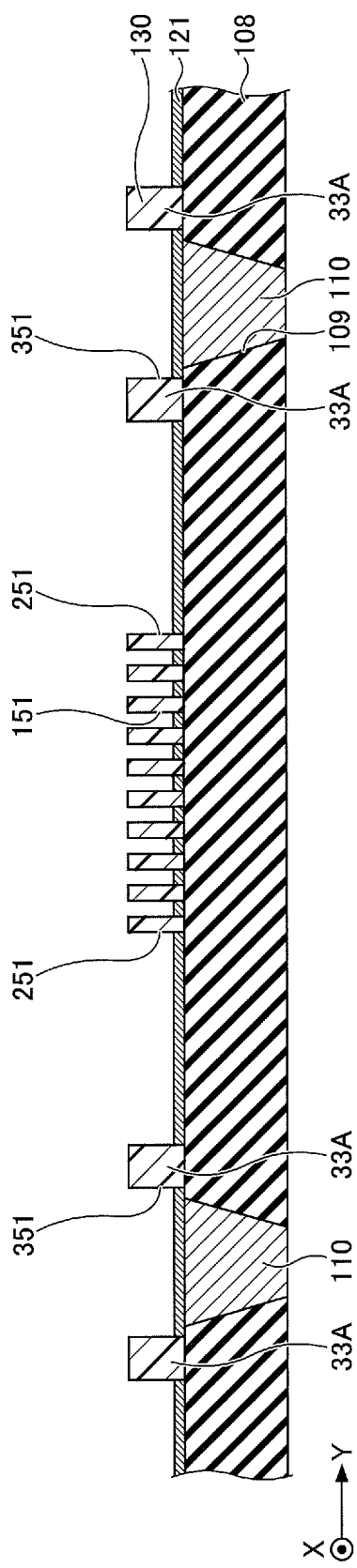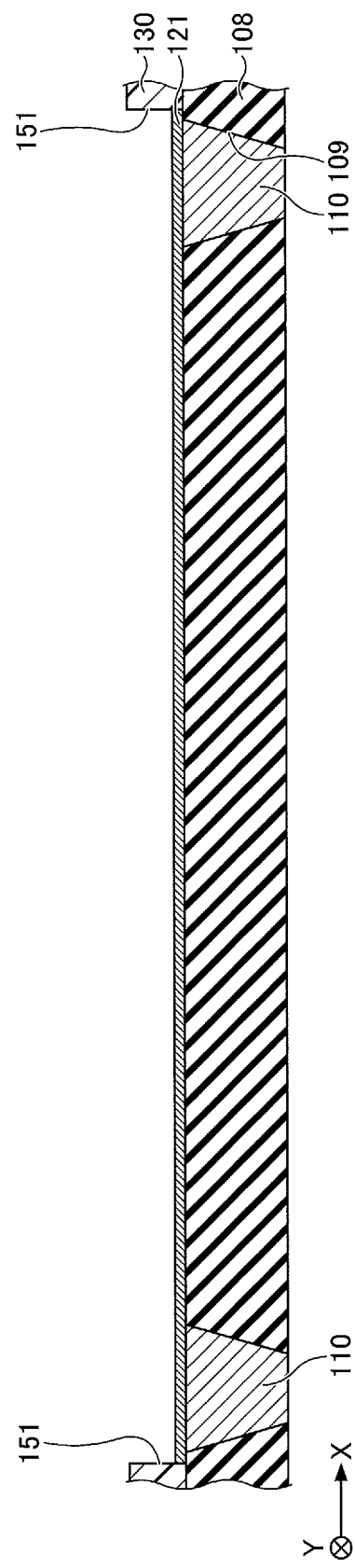

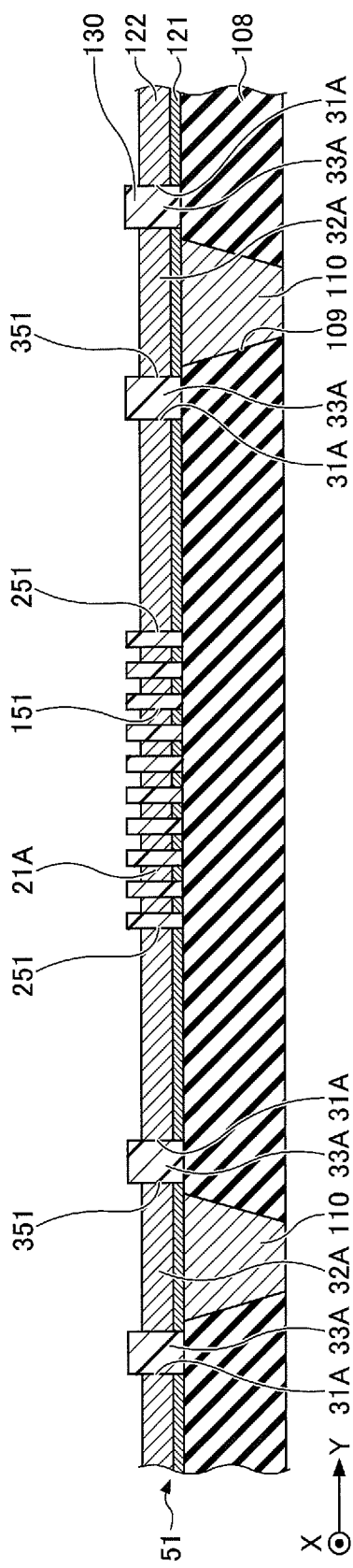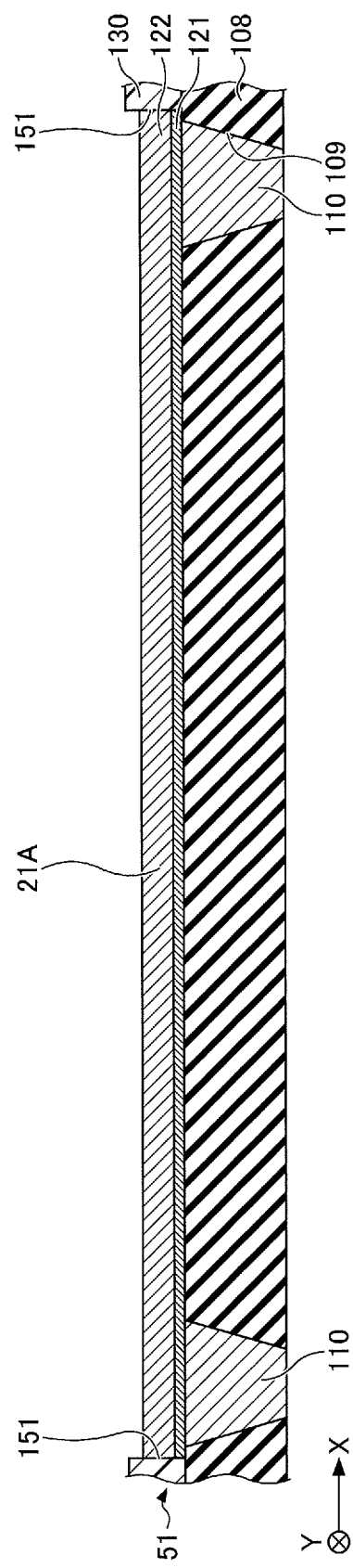

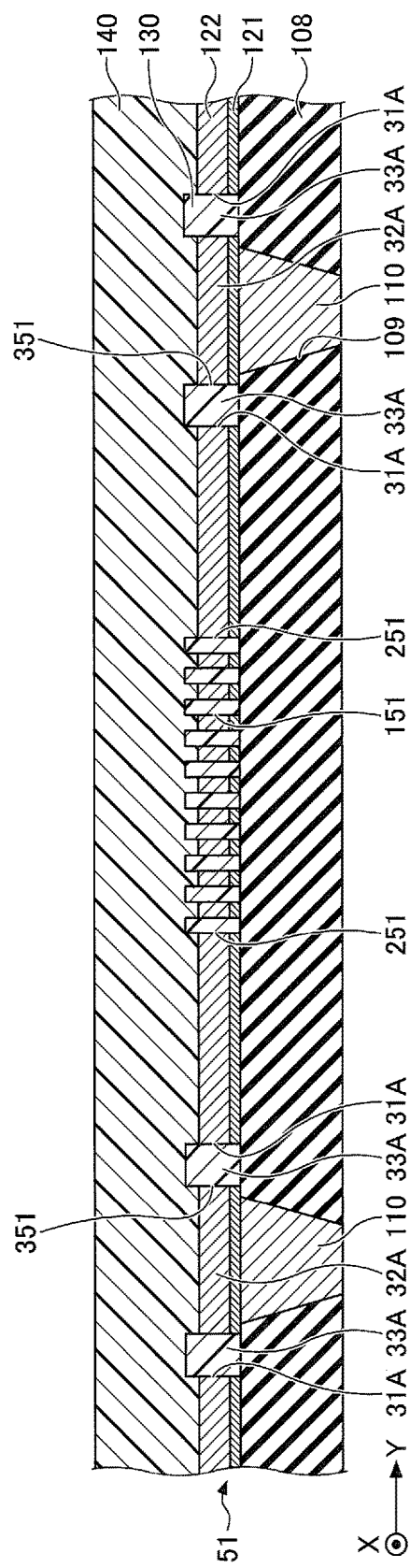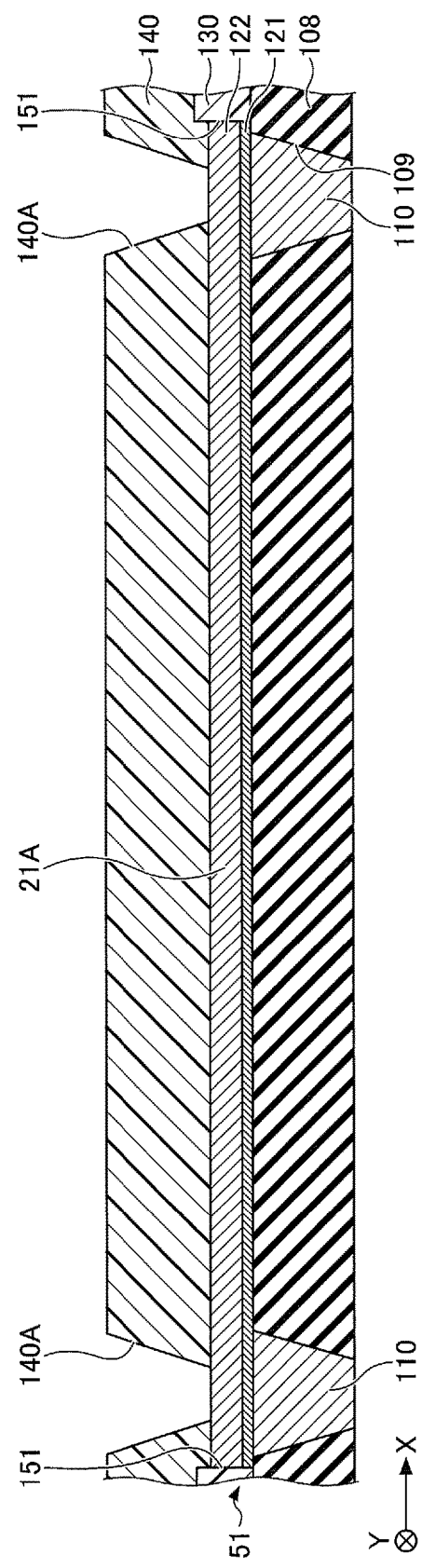

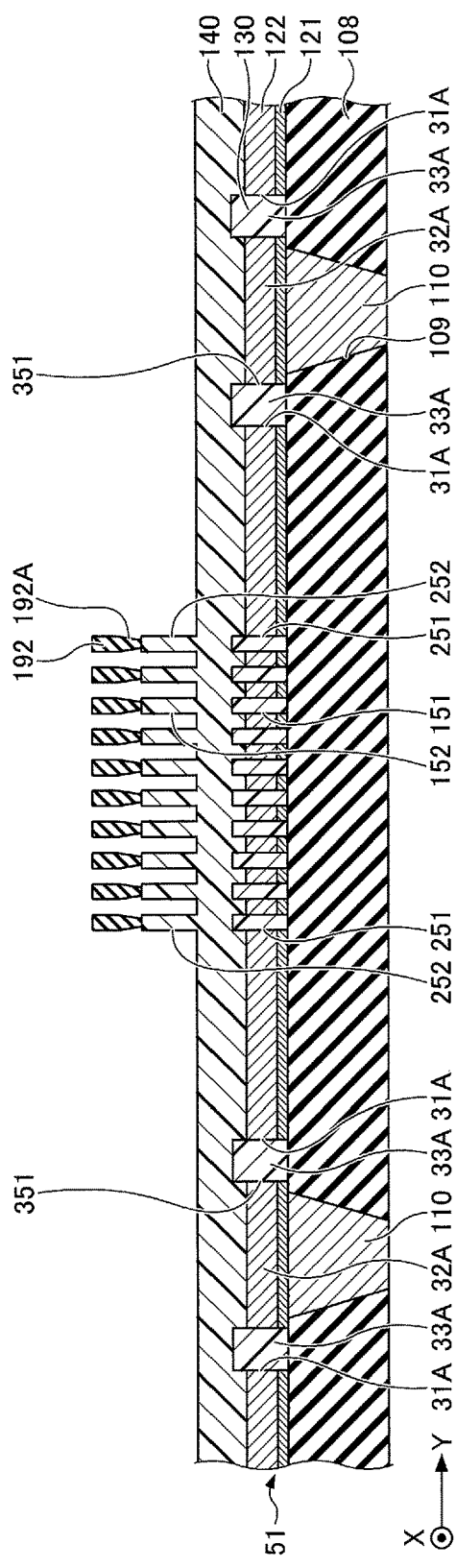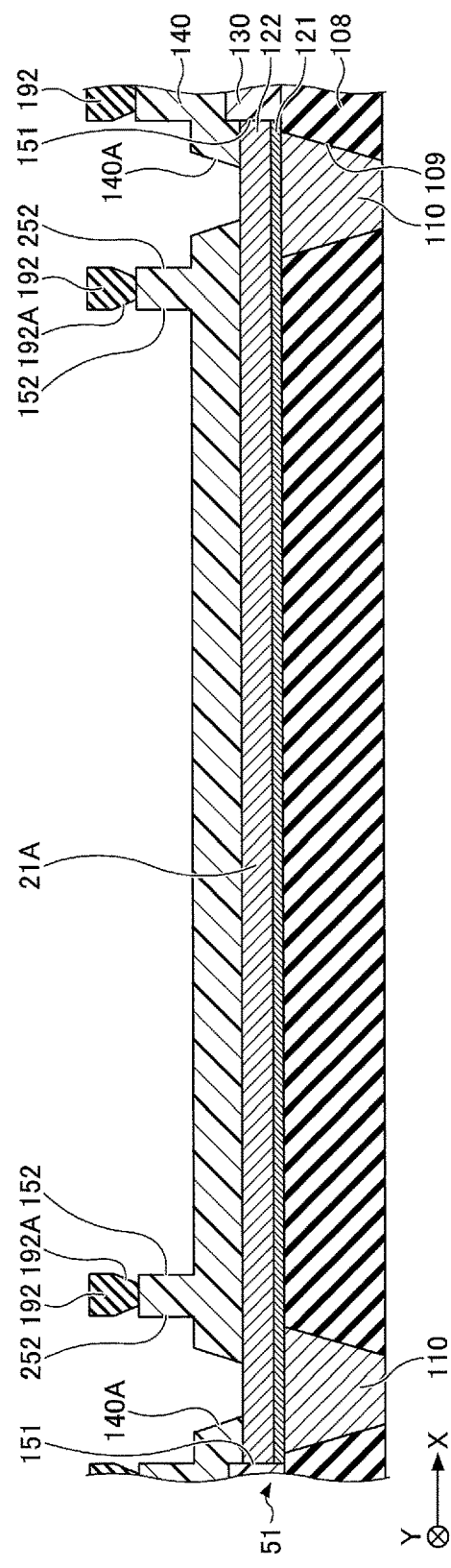
FIG.17A
FIG.17B

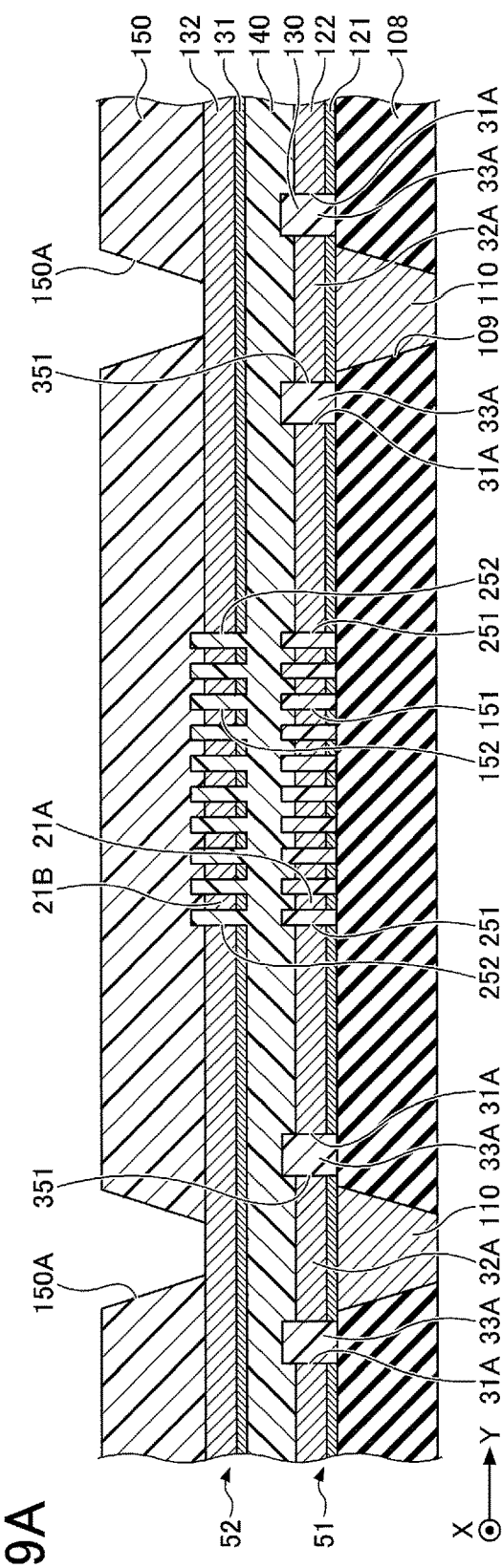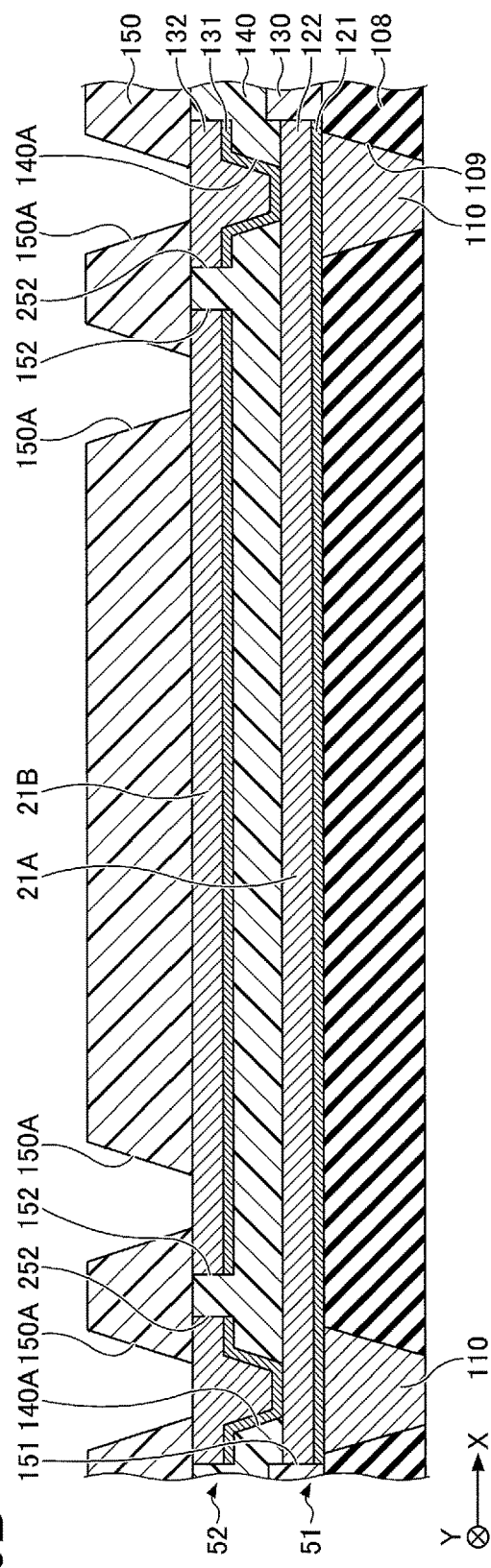

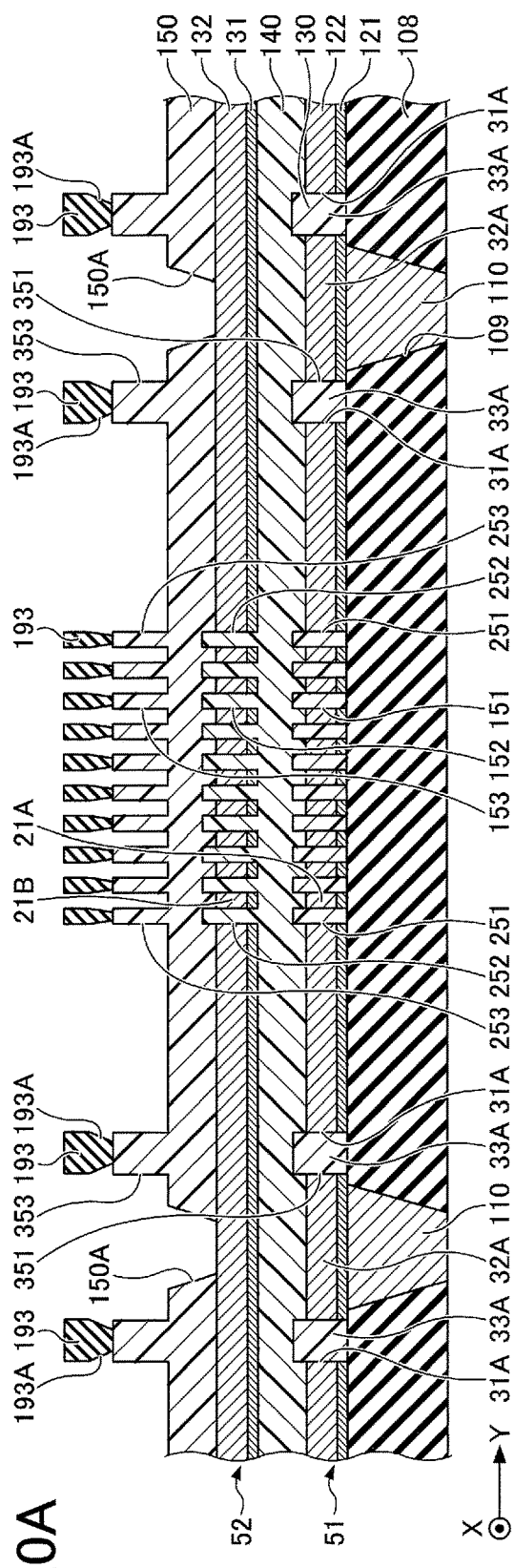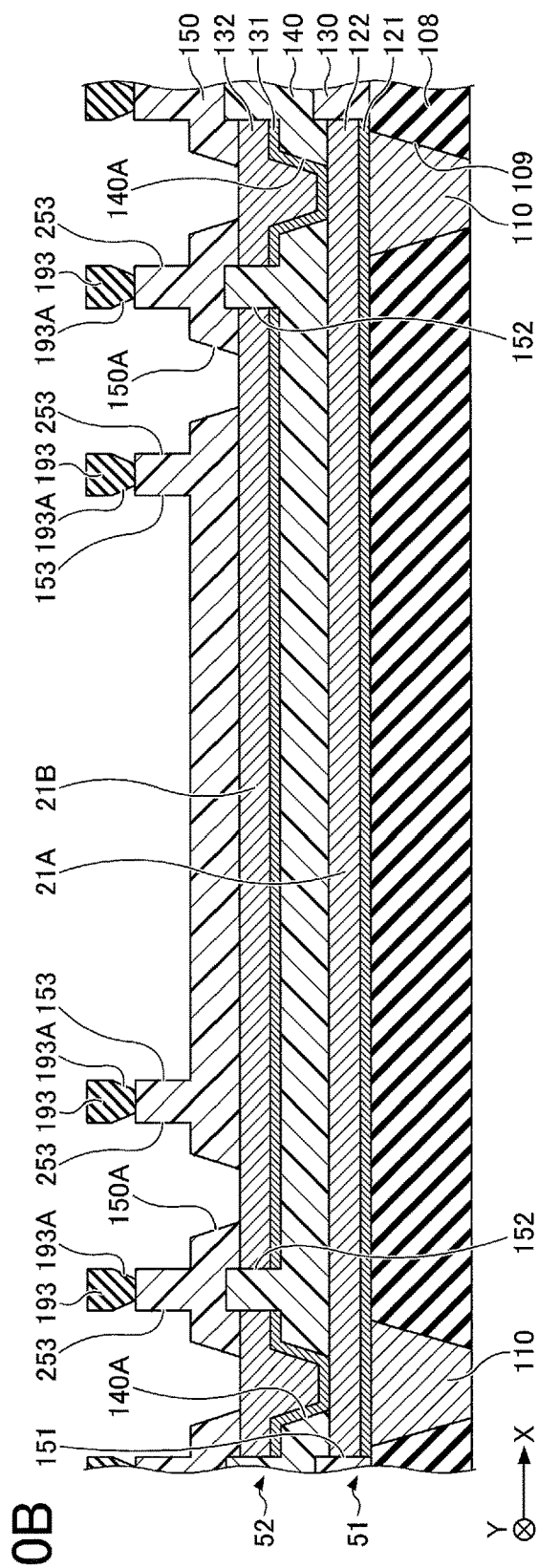

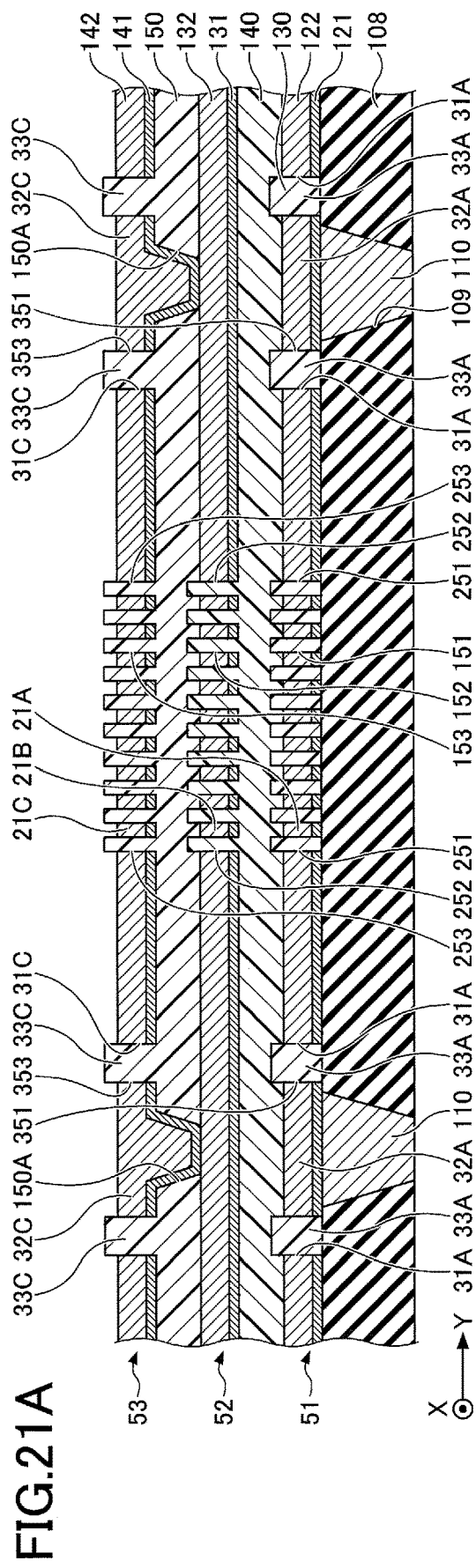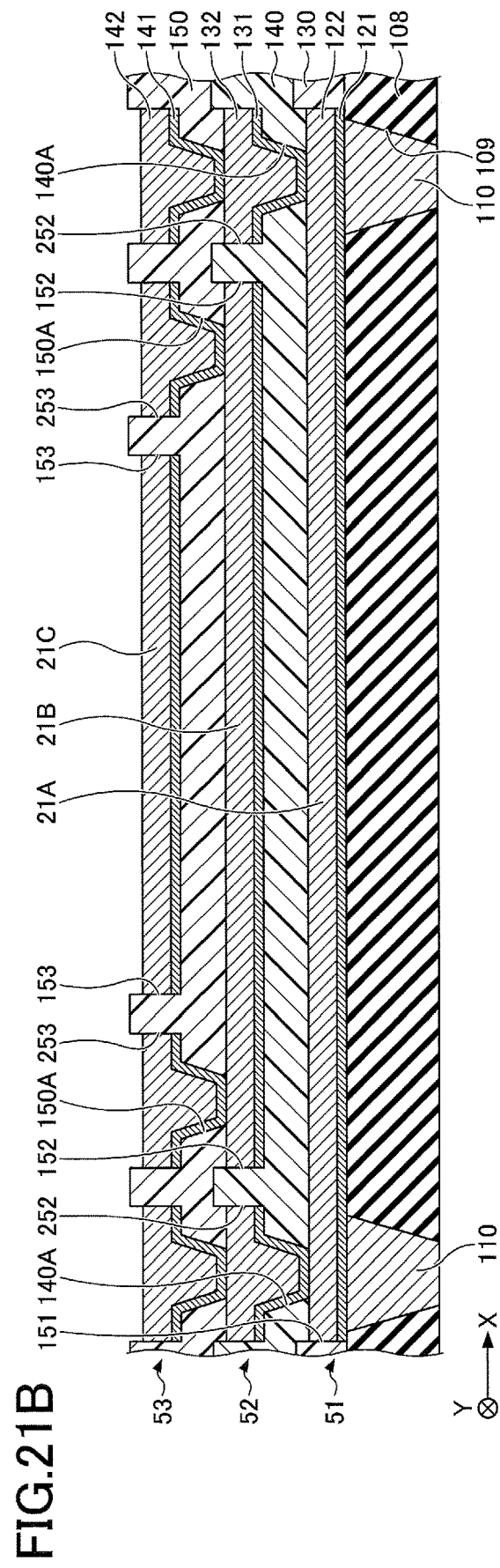

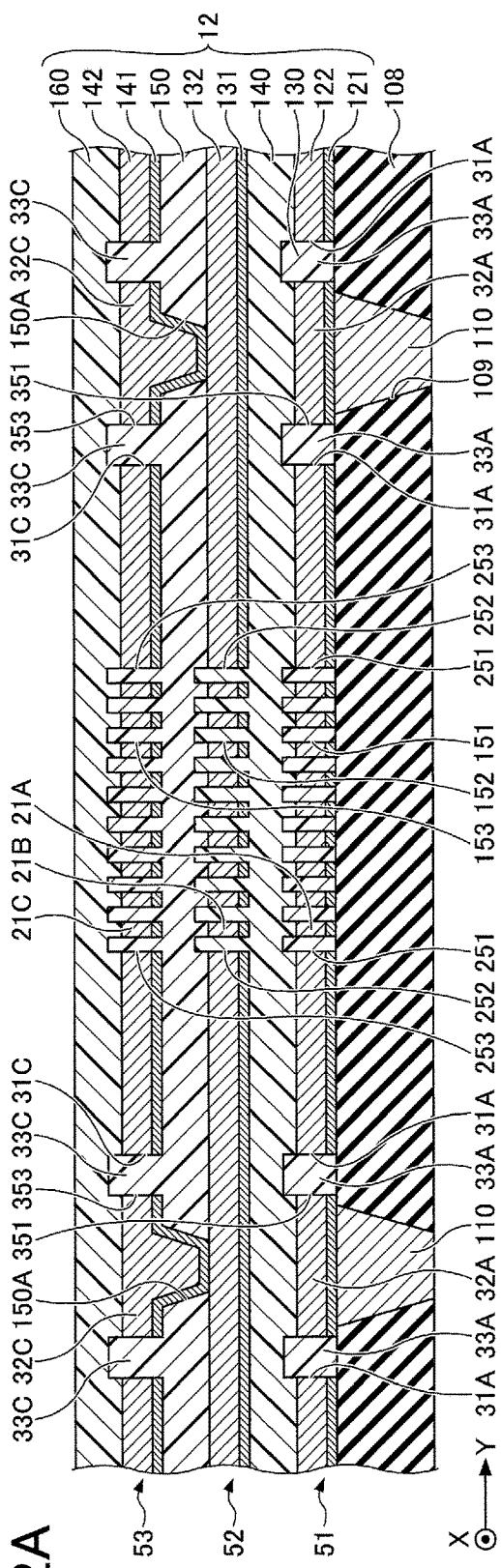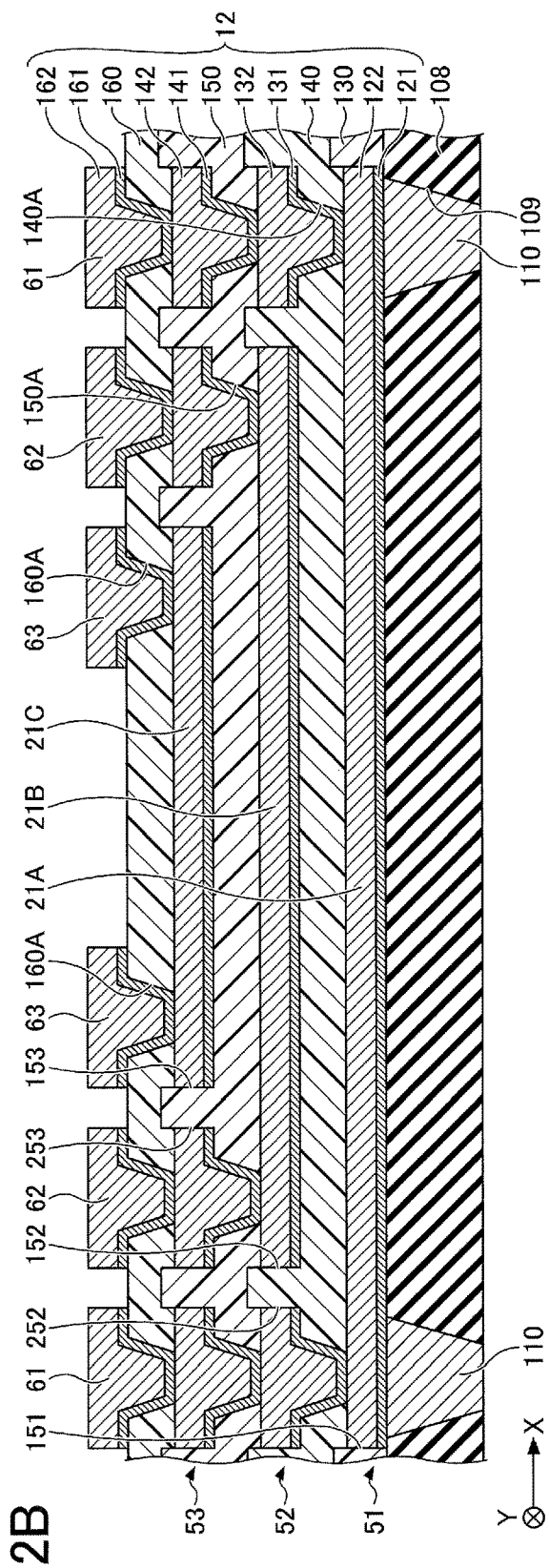

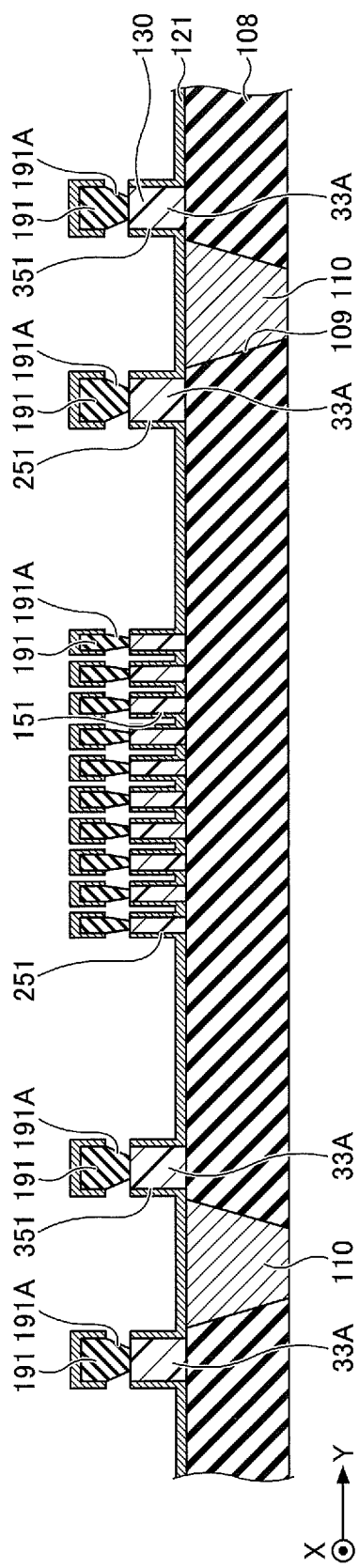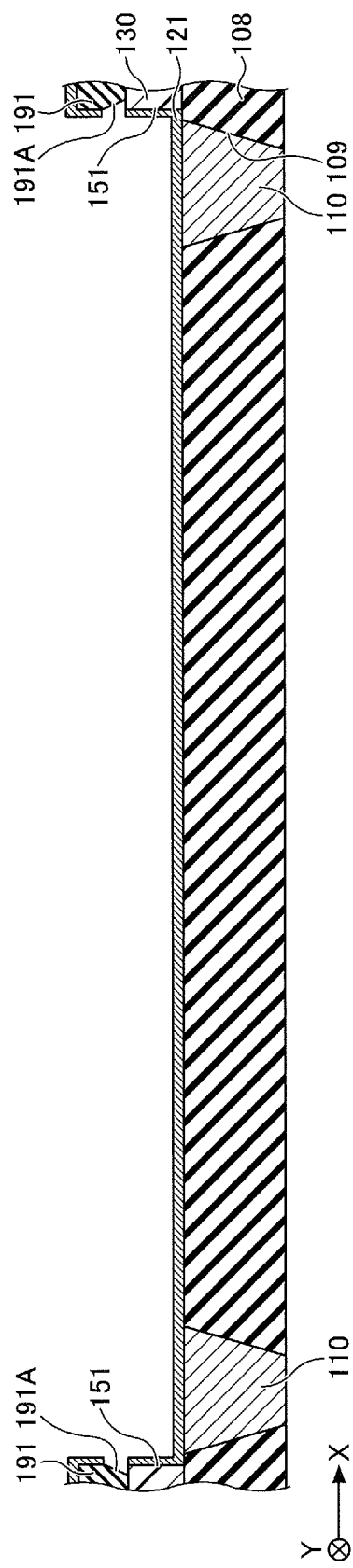

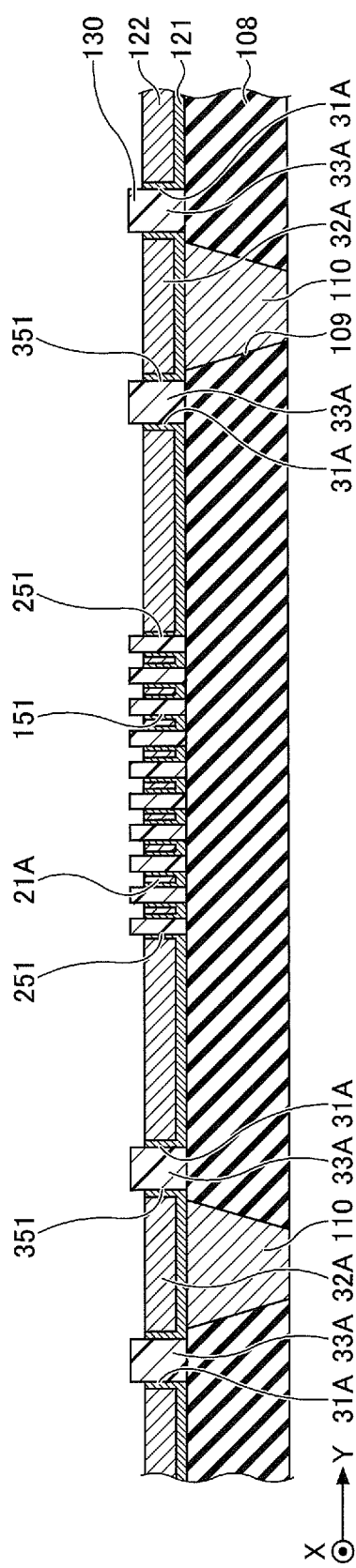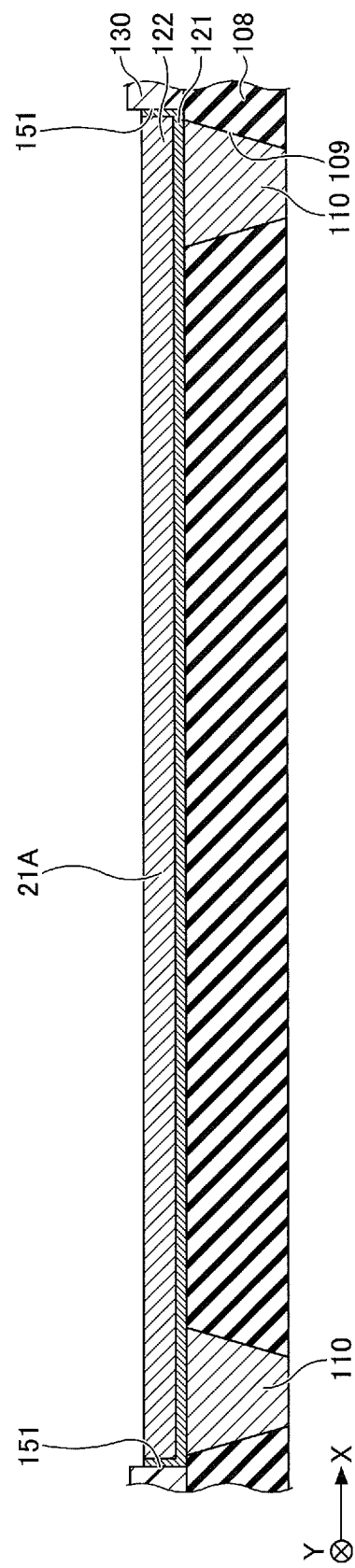

WIRING BOARD

CROSS-REFERENCE TO RELATED APPLICATION

This application is based upon and claims priority to Japanese Patent Application No. 2018-248131, filed on Dec. 28, 2018, the entire contents of which are incorporated herein by reference.

FIELD

Certain aspects of the embodiments discussed herein are related to a wiring board, and a method of manufacturing the wiring board.

BACKGROUND

A wiring board including a cavity formed between adjacent conductor patterns, to reduce ion migration between the adjacent conductor patterns, is described in Japanese Laid-Open Patent Publication No. 2016-051834, for example.

However, in the wiring board including the cavity formed between the adjacent conductor patterns, a connection failure may occur due to the cavity.

SUMMARY

Accordingly, it is an object in one aspect of the embodiments to provide a wiring board and a method of manufacturing the wiring board, which can reduce the connection failure.

According to one aspect of the embodiments, a wiring board includes an insulating layer that includes a first pattern and a second pattern, the first pattern including a plurality of first grooves extending parallel to each other, and a first projecting part separating adjacent first grooves, the second pattern including a second projecting part, and a second groove surrounding the second projecting part; and a metal layer that includes a wiring formed within the plurality of first grooves, and a degassing hole formed within the second pattern and having an opening formed by the second projecting part.

The object and advantages of the embodiments will be realized and attained by means of the elements and combinations particularly pointed out in the claims.

It is to be understood that both the foregoing general description and the following detailed description are exemplary and explanatory and not restrictive of the invention, as claimed.

BRIEF DESCRIPTION OF DRAWINGS

FIG. 9A and FIG. 9B are cross sectional views for explaining the method of manufacturing the wiring board according to the second embodiment;

FIG. 10A and FIG. 10B are cross sectional views for explaining the method of manufacturing the wiring board according to the second embodiment;

FIG. 11A and FIG. 11B are cross sectional views for explaining the method of manufacturing the wiring board according to the second embodiment;

FIG. 12A and FIG. 12B are cross sectional views for explaining the method of manufacturing the wiring board according to the second embodiment;

FIG. 14A and FIG. 14B are cross sectional views for explaining the method of manufacturing the wiring board according to the second embodiment;

FIG. 15A and FIG. 15B are cross sectional views for explaining the method of manufacturing the wiring board according to the second embodiment;

FIG. 16A and FIG. 16B are cross sectional views for explaining the method of manufacturing the wiring board according to the second embodiment;

FIG. 17A and FIG. 17B are cross sectional views for explaining the method of manufacturing the wiring board according to the second embodiment;

FIG. 19A and FIG. 19B are cross sectional views for explaining the method of manufacturing the wiring board according to the second embodiment;

FIG. 20A and FIG. 20B are cross sectional views for explaining the method of manufacturing the wiring board according to the second embodiment;

FIG. 21A and FIG. 21B are cross sectional views for explaining the method of manufacturing the wiring board according to the second embodiment;

FIG. 22A and FIG. 22B are cross sectional views for explaining the method of manufacturing the wiring board according to the second embodiment;

FIG. 23A and FIG. 23B are cross sectional views illustrating a modification of the second embodiment;

FIG. 25A and FIG. 25B are cross sectional views illustrating the modification of the second embodiment;

DESCRIPTION OF EMBODIMENTS

Figure 1:
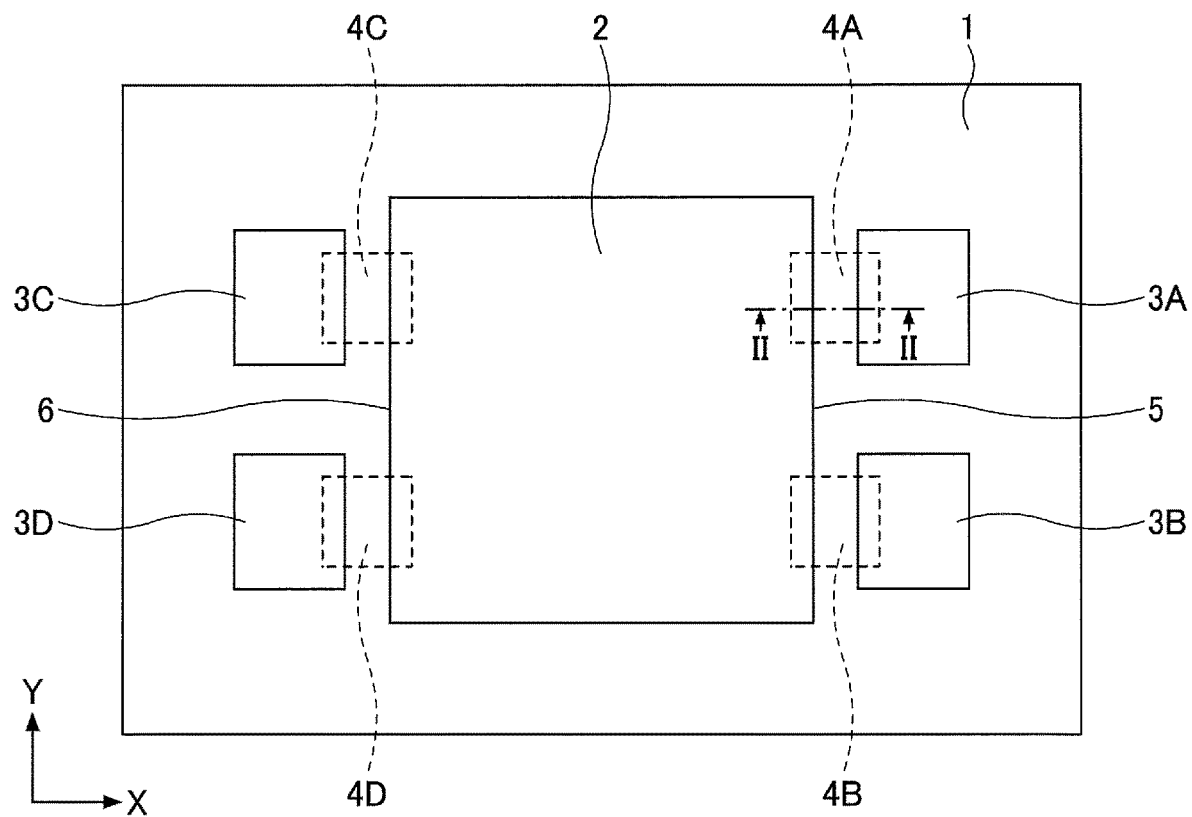
FIG. 1 is a diagram illustrating a layout of a wiring board according to a first embodiment.

The present inventor diligently studied to investigate the cause of the connection failure. As a result, the present inventor found that a void exists near a degassing hole that is provided in a periphery of a conductor pattern, and that peeling (or separation) of a layer is caused by this void. In addition, while the cause of the void that is generated is a micro-groove formed between the conductor patterns, the present inventor found that a groove is also formed inside the degassing hole, at the same time as the micro-groove, and that an insulating layer is not appropriately formed inside this groove.

Preferred embodiments of the present invention will be described with reference to the accompanying drawings. In the drawings, those parts that are the same are designated by the same reference numerals, and a repeated description of the same parts may be omitted.

A description will now be given of a wiring board and a method of manufacturing the wiring board in each embodiment according to the present invention.

First Embodiment

Figure 2:
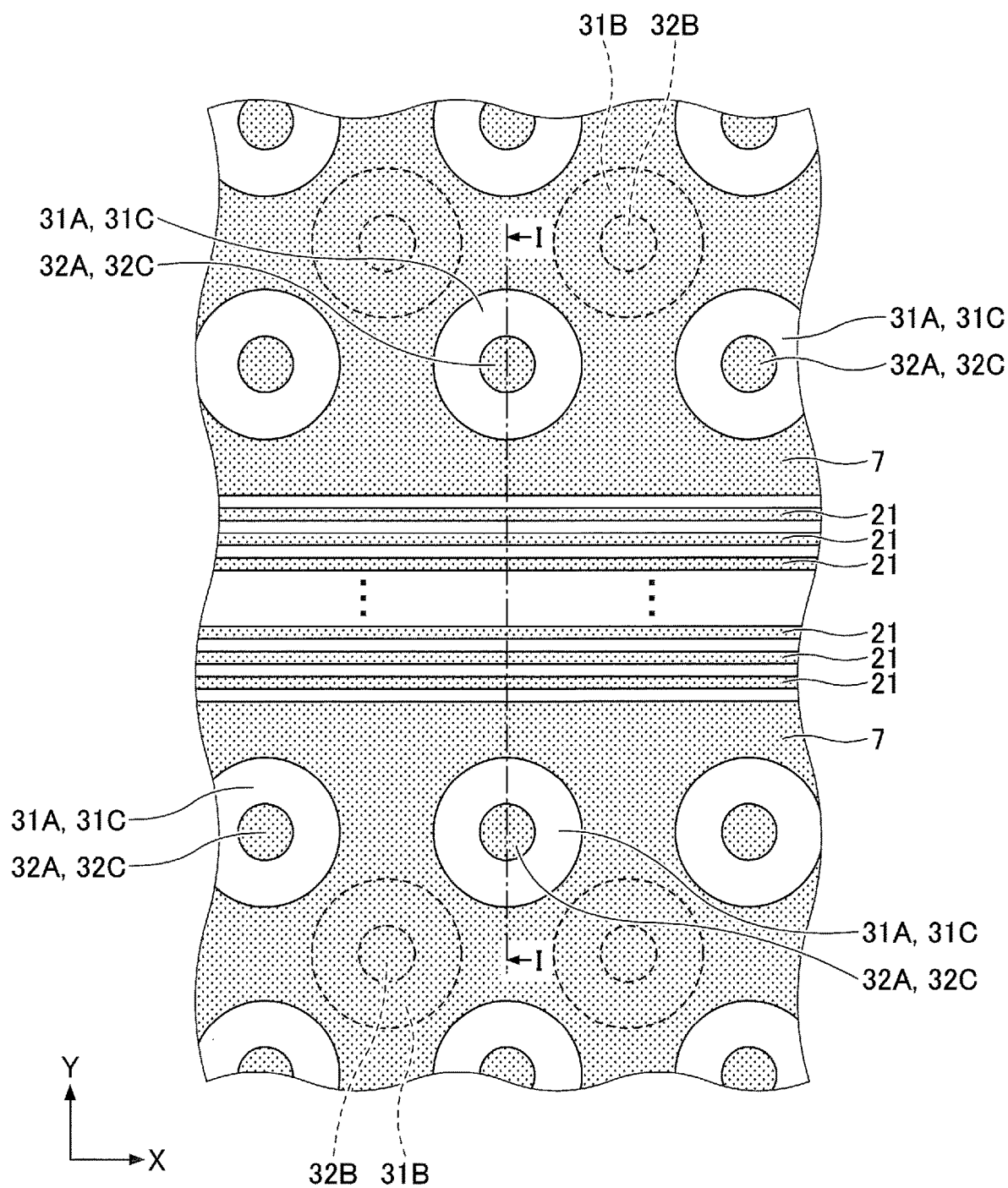
FIG. 2 is a diagram, on an enlarged scale, illustrating a micro-wiring region and a vicinity thereof in FIG. 1.

A first embodiment will be described. This first embodiment relates to the wiring board. FIG. 1 is a diagram illustrating a layout of the wiring board according to the first embodiment. FIG. 2 is a diagram, on an enlarged scale, illustrating a micro-wiring region and a vicinity thereof in FIG. 1.

As illustrated in FIG. 1, a wiring board 1 according to the first embodiment includes a first region 2 where a semiconductor integrated circuit chip, such as an Application Specific Integrated Circuit (ASIC) or the like, is mounted, and second regions 3A, 3B, 3C, and 3D where a semiconductor memory chip, such as a High Bandwidth Memory (HBM) or the like, is mounted. The first region 2 has a rectangular planar shape. The second regions 3A and 3B are arranged side by side along one side 5 of the first region 2, and the second regions 3C and 3D are arranged side by side along another side 6 of the first region 2, parallel to the side 5. In the following description, a direction in which the side 5 and the side 6 extend will be referred to as a Y-direction, and a direction perpendicular to the Y-direction on a plane parallel to a principal plane of the wiring board 1 will be referred to as a X-direction.

A micro-wiring region 4A is provided between the first region 2 and the second region 3A. The micro-wiring region 4A includes a plurality of micro-wirings electrically connecting the semiconductor integrated circuit chip that is mounted in the first region 2, and the semiconductor memory chip that is mounted in the second region 3A. A micro-wiring region 4B is provided between the first region 2 and the second region 3B. The micro-wiring region 4B includes a plurality of micro-wirings electrically connecting the semiconductor integrated circuit chip that is mounted in the first region 2, and the semiconductor memory chip that is mounted in the second region 3B. A micro-wiring region 4C is provided between the first region 2 and the second region 3C. The micro-wiring region 4C includes a plurality of micro-wirings electrically connecting the semiconductor integrated circuit chip that is mounted in the first region 2, and the semiconductor memory chip that is mounted in the second region 3C. A micro-wiring region 4D is provided between the first region 2 and the second region 3D. The micro-wiring region 4D includes a plurality of micro-wirings electrically connecting the semiconductor integrated circuit chip that is mounted in the first region 2, and the semiconductor memory chip that is mounted in the second region 3D.

FIG. 2 illustrates, as an example, the micro-wiring region 4A and a vicinity thereof, among the micro-wiring regions 4A through 4D. As illustrated in FIG. 2, the micro-wiring region 4A includes a plurality of micro-wirings 21 extending in the X-direction. The plurality of micro-wirings 21 are formed by a Line-and-Space (L/S) pattern in which a line width and a space width respectively are 1 μm to 5 μm, for example.

Ground regions 7 are provided in vicinities of the first region 2, the second regions 3A through 3D, and the micro-wiring regions 4A through 4D. A plurality of metal layers that are grounded, are provided in the ground region 7. In this example, 3 metal layers are provided in the ground region 7. A plurality of degassing holes 31A are formed in a first metal layer, a plurality of degassing holes 31B are formed in a second metal layer, and a plurality of degassing holes 31C are formed in a third metal layer. An anchor via pad 32A is provided at a central part of the degassing hole 31A, an anchor via pad 32B is provided at a central part of the degassing hole 31B, and an anchor via pad 32C is provided at a central part of the degassing hole 31C. In a plan view, the degassing hole 31A and the degassing hole 31C overlap, and the anchor via pad 32A and the anchor via pad 32C overlap. In the plan view, the degassing hole 31B is separated from the degassing holes 31A and 31C, and the anchor via pad 32B is separated from the anchor via pads 32A and 32C. For example, the degassing holes 31A through 31C have a diameter of 50 μm to 150 μm, and the anchor via pads 32A through 32C have a diameter of 20 μm to 40 μm.

Figure 3:
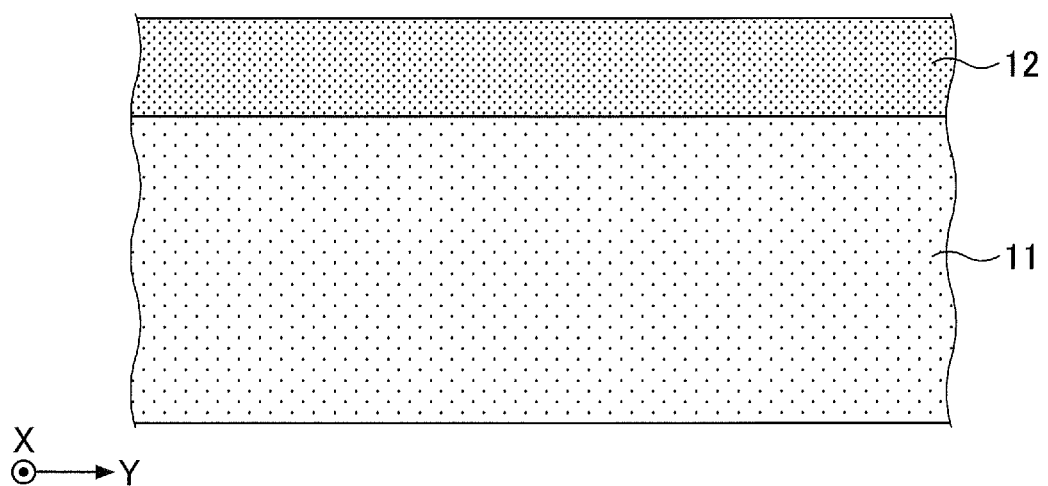
FIG. 3 is a cross sectional diagram schematically illustrating the wiring board according to the first embodiment.
Figure 4:
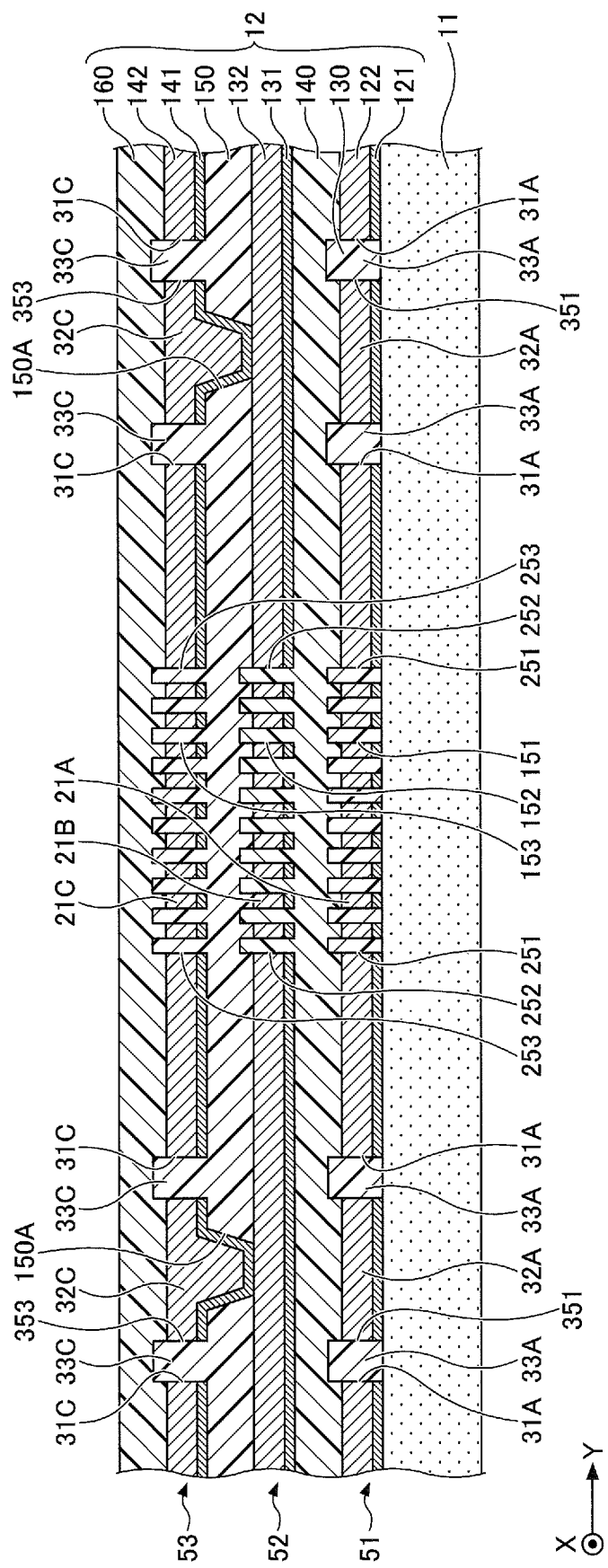
FIG. 4 is a cross sectional view illustrating details of a thin-film layer.
Figure 5:
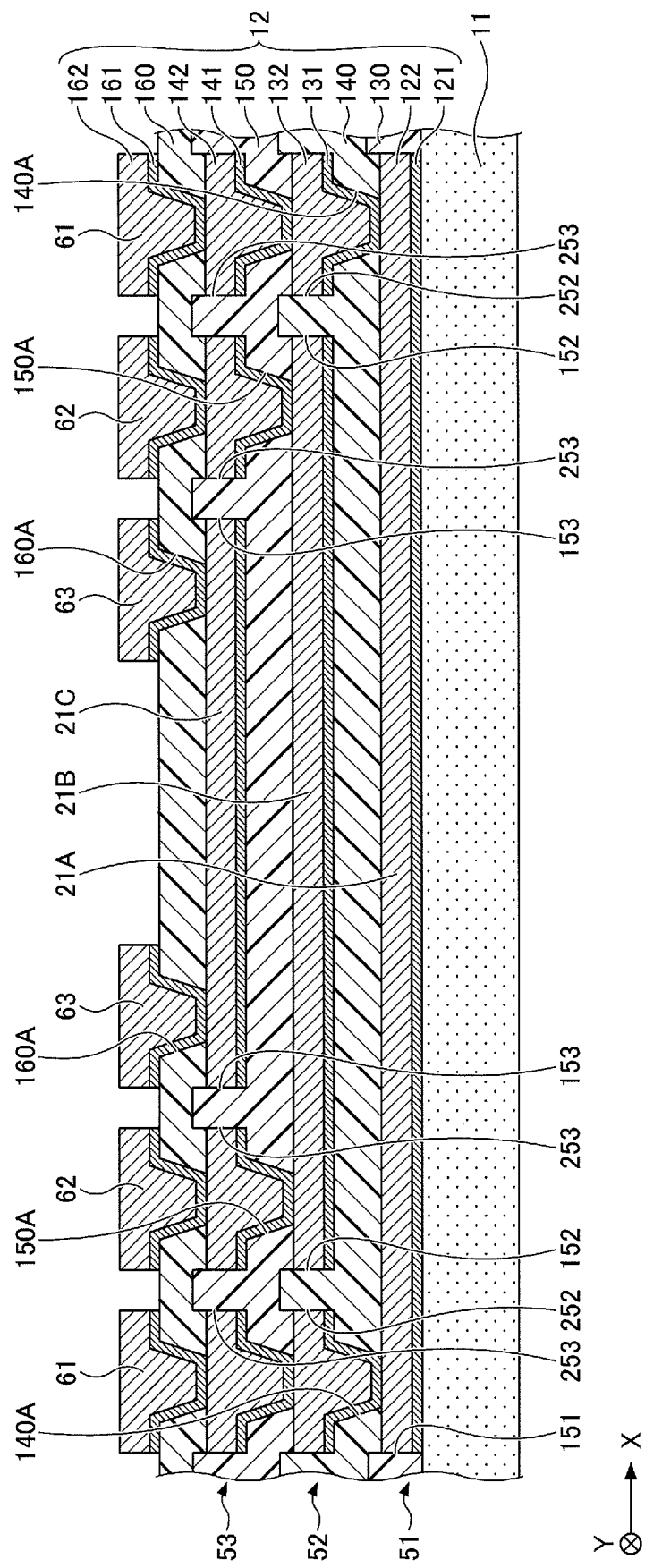
FIG. 5 is a cross sectional view illustrating the details of the thin-film layer.

Next, a cross sectional structure of the wiring board will be described. FIG. 3 is a cross sectional diagram schematically illustrating the wiring board according to the first embodiment. FIG. 4 and FIG. 5 are cross sectional views illustrating details of a thin-film layer. FIG. 4 corresponds to a cross sectional view along a line I-I in FIG. 2, and FIG. 5 corresponds to a cross sectional view along a line II-II in FIG. 1.

As illustrated in FIG. 3, the wiring board 1 includes a buildup substrate 11, and a thin-film layer 12 formed on one surface (that is, an upper surface in this example) of the buildup substrate 11. The micro-wirings 21 are formed in the thin-film layer 12. In the following description, the surface of the buildup substrate 11 formed with the thin-film layer 12 may be referred to as a mounting side, and a surface of the buildup substrate 11 opposite to the mounting side may be referred to as a non-mounting side.

As illustrated in FIG. 4, the thin-film layer 12 includes a third insulating layer 130 formed on the buildup substrate 11, and a first micro-wiring layer 51a formed on the third insulating layer 130. The first micro-wiring layer 51 includes a seed layer 121, and a metal plated layer 122. For example, the seed layer 121 includes a titanium layer, and a copper layer formed on the titanium layer, and the metal plated layer 122 is a copper plated layer. The first micro-wiring layer 51 includes micro-wirings 21A, the degassing holes 31A, and the anchor via pads 32A. The micro-wirings 21A are formed within the micro-wiring regions 4A through 4D, and the degassing holes 31A and the anchor via pads 32A are formed within the ground regions 7. The micro-wirings 21A are a part of the micro-wiring 21. An upper surface of the micro-wirings 21A is located below an upper surface of the third insulating layer 130.

The third insulating layer 130 includes a plurality of micro-grooves 151, grooves 251 surrounding projecting parts 33A that become openings of the degassing holes 31A, and grooves 351 for the anchor via pads 32A inside the projecting parts 33A. The micro-wirings 21A are formed within the plurality of micro-grooves 151, and the anchor via pads 32A are formed within the grooves 351. The micro-grooves 151 are formed at a line part of the L/S pattern including the micro-wirings 21A. For example, the degassing holes 31A and the anchor via pads 32A respectively have a circular planar shape. The metal plated layer 122 is an example of a metal layer, the pattern within the micro-wiring regions 4A through 4D of the third insulating layer 130 is an example of a first pattern, and a pattern within the ground regions 7 of the third insulating layer 130 is an example of a second pattern. The micro-wirings 21A are examples of wirings, and the micro-grooves 151 are examples of first grooves. The grooves 251 are examples of second grooves, and the grooves 351 are examples of third grooves.

The thin-film layer 12 includes a fourth insulating layer 140 formed on the third insulating layer, and a second micro-wiring layer 52 formed on the fourth insulating layer 140. The second micro-wiring layer 52 includes a seed layer 131, and a metal plated layer 132. For example, the seed layer 131 includes a titanium layer, and a copper layer formed on the titanium layer, and the metal plated layer 132 is a copper plated layer. The second micro-wiring layer 52 includes micro-wirings 21B, the degassing holes 31B, and the anchor via pads 32B, as illustrated in FIG. 2. The micro-wirings 21B are formed within the micro-wiring regions 4A through 4D, and the degassing holes 31B and the anchor via pads 32B are formed within the ground regions 7. The micro-wirings 21B are a part of the micro-wiring 21. An upper surface of the micro-wirings 21B is located below an upper surface of the fourth insulating layer 140.

The fourth insulating layer 140 includes a plurality of micro-grooves 152, grooves 252 surrounding projecting parts (not illustrated) that become openings of the degassing holes 31B, and grooves (not illustrated) for the anchor via pads 32B inside the projecting parts. The micro-wirings 21B are formed within the plurality of micro-grooves 152, and the anchor via pads 32B are formed within the grooves for the anchor via pads 32B inside the projecting parts. The micro-grooves 152 are formed at a line part of the L/S pattern including the micro-wirings 21B. For example, the degassing holes 31B and the anchor via pads 32B respectively have a circular planar shape. The metal plated layer 132 is an example of a metal layer, the pattern within the micro-wiring regions 4A through 4D of the fourth insulating layer 140 is an example of a first pattern, and a pattern within the ground regions 7 of the fourth insulating layer 140 is an example of a second pattern. The micro-wirings 21B are examples of wirings, and the micro-grooves 152 are examples of first grooves. The grooves 252 are examples of second grooves, and the grooves for the anchor via pads 32B are examples of third grooves.

The thin-film layer 12 includes a fifth insulating layer 150 formed on the buildup substrate 11, and a third micro-wiring layer 53 formed on the fifth insulating layer 150. The third micro-wiring layer 53 includes a seed layer 141, and a metal plated layer 142. For example, the seed layer 141 includes a titanium layer, and a copper layer formed on the titanium layer, and the metal plated layer 142 is a copper plated layer. The third micro-wiring layer 53 includes micro-wirings 21C, the degassing holes 31C, and the anchor via pads 32C. The micro-wirings 21C are formed within the micro-wiring regions 4A through 4D, and the degassing holes 31C and the anchor via pads 32C are formed within the ground regions 7. The micro-wirings 21C are a part of the micro-wiring 21. An upper surface of the micro-wirings 21C is located below an upper surface of the fifth insulating layer 150.

The fourth insulating layer 140 includes a plurality of micro-grooves 153, grooves 253 surrounding projecting parts 33C that become openings of the degassing holes 31C, and grooves 353 for the anchor via pads 32C inside the projecting parts 33C. The micro-wirings 21C are formed within the plurality of micro-grooves 153, and the anchor via pads 32C are formed within the grooves 353. The micro-grooves 153 are formed at a line part of the L/S pattern including the micro-wirings 21C. For example, the degassing holes 31C and the anchor via pads 32C respectively have a circular planar shape. The metal plated layer 142 is an example of a metal layer, the pattern within the micro-wiring regions 4A through 4D of the fifth insulating layer 150 is an example of a first pattern, and a pattern within the ground regions 7 of the fifth insulating layer 150 is an example of a second pattern. The micro-wirings 21C are examples of wirings, and the micro-grooves 153 are examples of first grooves. The grooves 253 are examples of second grooves, and the grooves 353 are examples of third grooves.

Micro-via holes 150A are formed in the fifth insulating layer 150, and the anchor via pads 32C are joined, by metal-to-metal bonding, to the second micro-wiring layer 52 via the micro-via holes 150A. In addition, micro-via holes 140A are formed in the fourth insulating layer 140, as illustrated in FIG. 5, and the anchor via pads 32B are joined, by metal-to-metal bonding, to the first micro-wiring layer 51 via the micro-via holes 140A. Accordingly, the first micro-wiring layer 51, the second micro-wiring layer 52, and the third micro-wiring layer 53 are joined to one another, by metal-to-metal bonding, within the ground regions 7. Consequently, a strong bonding strength can be obtained by the anchor effect.

As illustrated in FIG. 5, the thin-film layer 12 includes a sixth insulating layer 160, including the micro-via holes 160A above parts of the third micro-wiring layer 51, formed on the third micro-wiring layer 53 and the fifth insulating layer 150. In addition, the thin-film layer 12 includes connection terminals 61, 62, and 63 that connect to end parts of the micro-wiring 21 and project from the fifth insulating layer 150. The connection terminals 61 electrically connect to the micro-wirings 21A of the first micro-wiring layer 51, the connection terminals 62 electrically connect to the micro-wirings 21B of the second micro-wiring layer 52, and the connection terminals 63 electrically connect to the micro-wirings 21C of the third micro-wiring layer 53. The connection terminals 61 through 63 respectively include a seed layer 161 and a metal plated layer 162. For example, the seed layer 161 includes a titanium layer, and a copper layer famed on the titanium layer, and the metal plated layer 162 is a copper plated layer.

According to the wiring board 1, the projecting part for separating the micro-grooves 151 is provided between the adjacent micro-wirings 21A, to reduce ion migration between the adjacent micro-wirings 21A. Similarly, the projecting part for separating the micro-grooves 152 is provided between the adjacent micro-wirings 21B, to reduce ion migration between the adjacent micro-wirings 21B, and the projecting part for separating the micro-grooves 153 is provided between the adjacent micro-wirings 21C, to reduce ion migration between the adjacent micro-wirings 21C.

Further, since no groove is formed inside each of the degassing holes 31A through 31C, voids are uneasily generated in the third insulating layer 130, the fourth insulating layer 140, and the fifth insulating layer 150. Hence, it is possible to reduce peeling (or separation) of the layer within the thin-film layer 12, and reduce the connection failure associated with the peeling.

Second Embodiment

Next, a second embodiment will be described. This second embodiment relates to a method of manufacturing the wiring board 1 according to the first embodiment. FIG. 6A through FIG. 22B are cross sectional views for explaining the method of manufacturing the wiring board according to the second embodiment. This second embodiment first forms the buildup substrate 11, and thereafter forms the thin-film layer 12 on the buildup substrate 11. FIG. 6A through FIG. 8 are cross sectional views illustrating a method of forming the buildup substrate. FIG. 9A through FIG. 22B are cross sectional views illustrating a method of forming the thin-film layer. FIG. 9A, FIG. 10A, FIG. 11A, . . . , and FIG. 22A illustrate a part corresponding to the cross sectional view along the line I-I in FIG. 2. FIG. 9B, FIG. 10B, FIG. 11B, . . . , and FIG. 22B illustrate a part corresponding to the cross sectional view along the line II-II in FIG. 1.

Figure 6A:
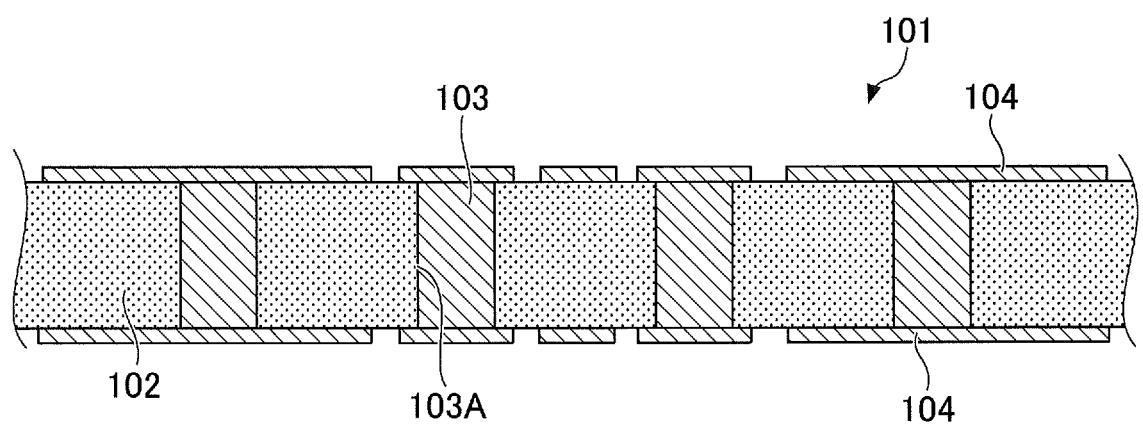
FIG. 6A and FIG. 6B are cross sectional views for explaining a method of manufacturing the wiring board according to a second embodiment.

First, as illustrated in FIG. 6A, a core wiring board 101 is prepared as a support body. The core wiring board 101 includes a core substrate 102, and a first wiring layer 104. The core substrate 102 includes through holes 103A that penetrate the core substrate 102 in a thickness direction of the core substrate 102. A through-conductor 103 is provided within the through hole 103A. For example, the through holes 103A may be formed by drilling, laser beam machining, or the like. For example, the through-conductor 103 and the first wiring layer 104 may be formed by plating, photolithography, or the like. A large board from which a plurality of wiring boards 1 can be made, may be used for the core wiring board 101. In other words, the core wiring board 101 includes a plurality of regions where structures each corresponding to the wiring board 1 are formed.

Figure 6B:
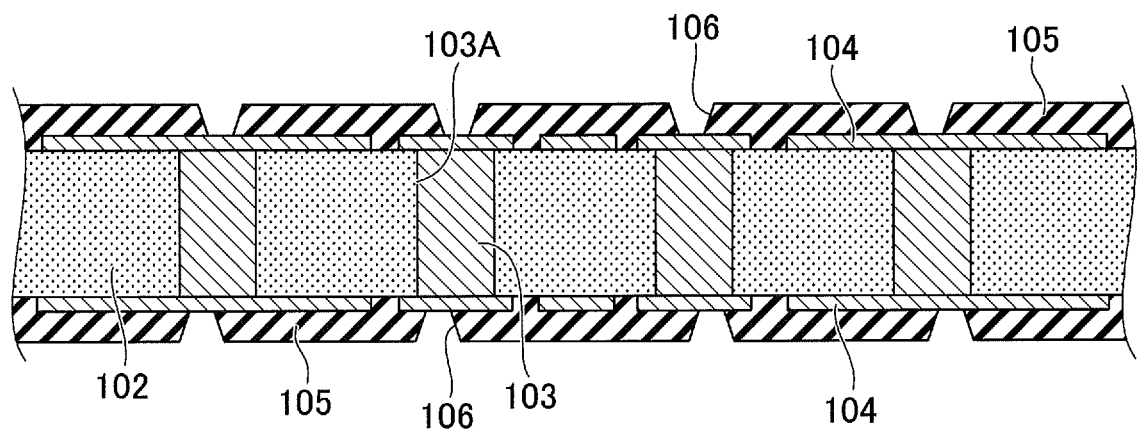

Next, as illustrated in FIG. 6B, an uncured resin film is adhered on both sides (that is, both upper and lower surfaces in this example) of the core substrate 102, and the uncured resin film is cured by performing a heat treatment, to form a first insulating layer 105. The first insulating layer 105 may be formed by an insulating resin, such as epoxy resins, polyimide resins, or the like. The first insulating layer 105 may be formed by coating a liquid resin. Thereafter, laser beam machining is performed on the first insulating layer 105 that is provided on both sides of the core substrate 102, to form, in the first insulating layer 105, via holes 106 respectively reaching a connection part of the first wiring layer 104.

Figure 7A:
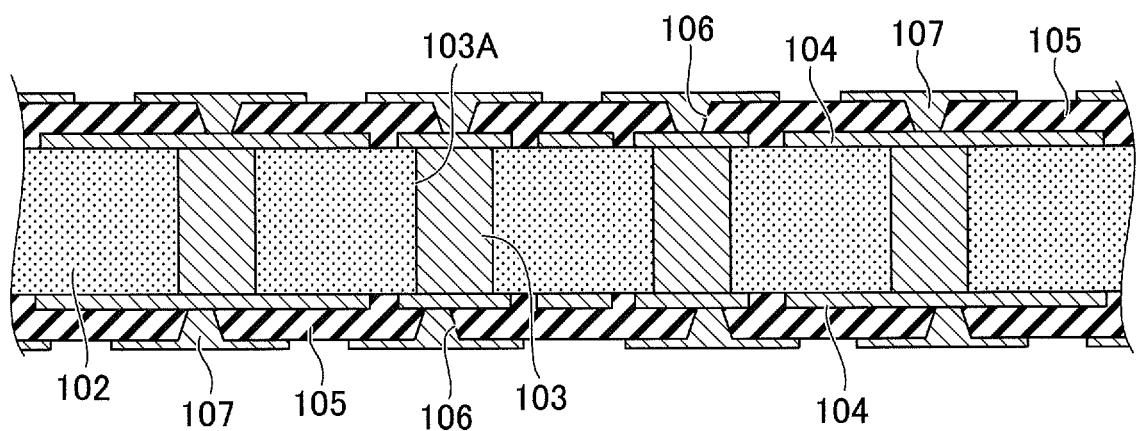
FIG. 7A and FIG. 7B are cross sectional views for explaining the method of manufacturing the wiring board according to the second embodiment.

Next, as illustrated in FIG. 7A, a second wiring layer 107, that electrically connects to the first wiring layer 104 through a via conductor within the via holes 106, is formed on the first insulating layer 105 that is provided on both sides of the core substrate 102. The second wiring layer 107 may be formed by a semi-additive method.

Figure 7B:
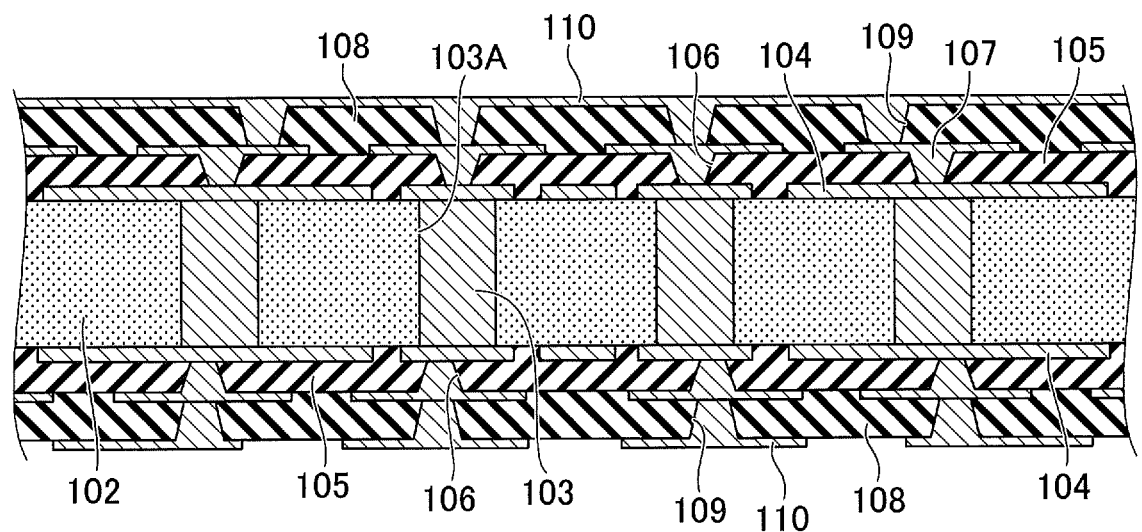

After forming the second wiring layer 107, a second insulating layer 108, including via holes 109 at a connection part of the second wiring layer 107, is formed on the first insulating layer 105 that is provided on both sides of the core substrate 102, as illustrated in FIG. 7B. The second insulating layer 108 may be formed by a method similar to that used to form the first insulating layer 105.

Further, as also illustrated in FIG. 7B, a third wiring layer 110, that electrically connects to the second wiring layer 107 through a via conductor within the via holes 109, is formed on the second insulating layer 108 that is provided on both sides of the core substrate 102. The third wiring layer 110 may be formed by a semi-additive method similar to that used to form the second wiring layer 107. However, on the mounting side of the core substrate 102, the third wiring layer 110 may be formed as a solid layer (or continuous layer), without forming the wiring pattern of the third wiring layer 110 on the second insulating layer 108.

Figure 8:
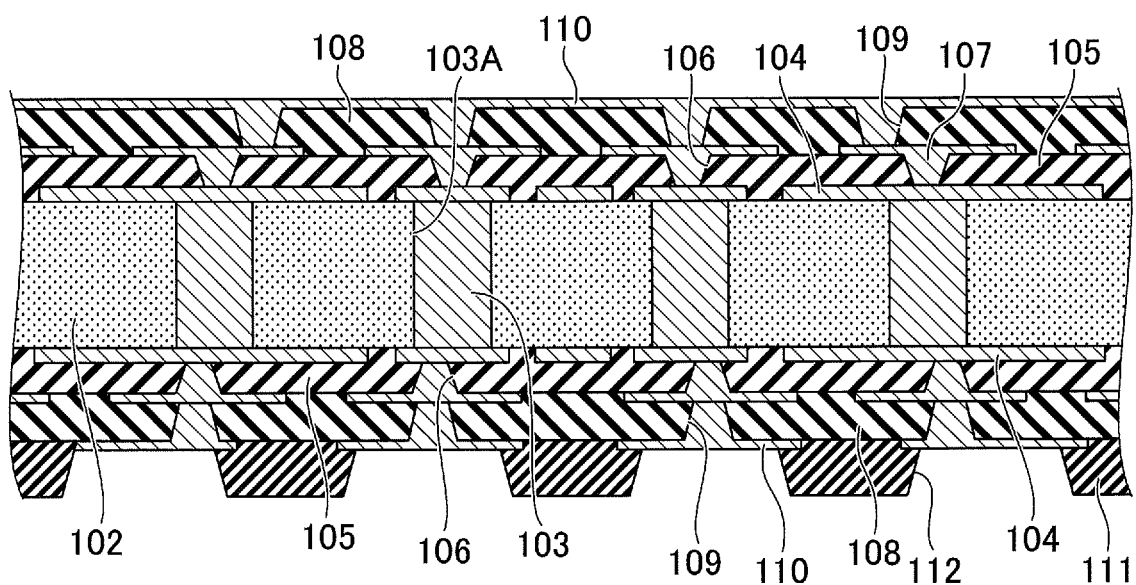
FIG. 8 is a cross sectional view for explaining the method of manufacturing the wiring board according to the second embodiment.

Next, as illustrated in FIG. 8, on the non-mounting side of the core substrate 102, a solder resist layer 111 is formed on the second insulating layer 108. Thereafter, openings 112 respectively reaching a connection part of the third wiring layer 110 are formed in the solder resist layer 111.

The solder resist layer 111 may be formed by an insulating resin, such as photosensitive epoxy resins, photosensitive acrylic resins, or the like. The solder resist layer 111 may be formed by adhering a resin film, or by coating a liquid resin. The openings 112 may be formed by exposing and developing the solder resist layer 111. An insulating resin, such as non-photosensitive epoxy resins, non-photosensitive acrylic resins, or the like may be used for the solder resist layer 111. In this case, the opening 112 may be formed by performing laser beam machining or blasting with respect to the non-photosensitive resin.

The buildup substrate 11 can be formed by the processes described heretofore.

Next, as illustrated in FIG. 9A and FIG. 9B, the surface on the mounting side of the buildup substrate 11 is polished by chemical mechanical polishing, to expose the second insulating layer 108.

Thereafter, as illustrated in FIG. 10A and FIG. 10B, the third insulating layer 130 is formed on the third wiring layer 110 and the second insulating layer 108. For example, the third insulating layer 130 may be formed by an insulating resin, such as photosensitive epoxy resins or the like.

Next, as illustrated in FIG. 11A and FIG. 11B, a photoresist layer 191, including an opening at a part where the first micro-wiring layer 51 is formed, is formed on the third insulating layer 130. The photoresist layer 191 includes a constricted part 191A near an interface between the photoresist layer 191 and the third insulating layer 130. For example, the photoresist layer 191 includes openings at parts where the micro-wirings 21A are formed and at parts where the anchor via pads 32A are formed, and covers parts where the degassing holes 31A are formed.

Next, as illustrated in FIG. 12A and FIG. 12B, the third insulating layer 130 is etched, using the photoresist layer 191 as a mask. As a result, the micro-grooves 151 are formed in the third insulating layer 130 at the line parts of the L/S pattern that includes a region where the micro-wirings 21A are formed. In addition, the grooves 251 are formed in the third insulating layer 130 in regions or the like where the anchor via pads 32A are formed.

Figure 13A:
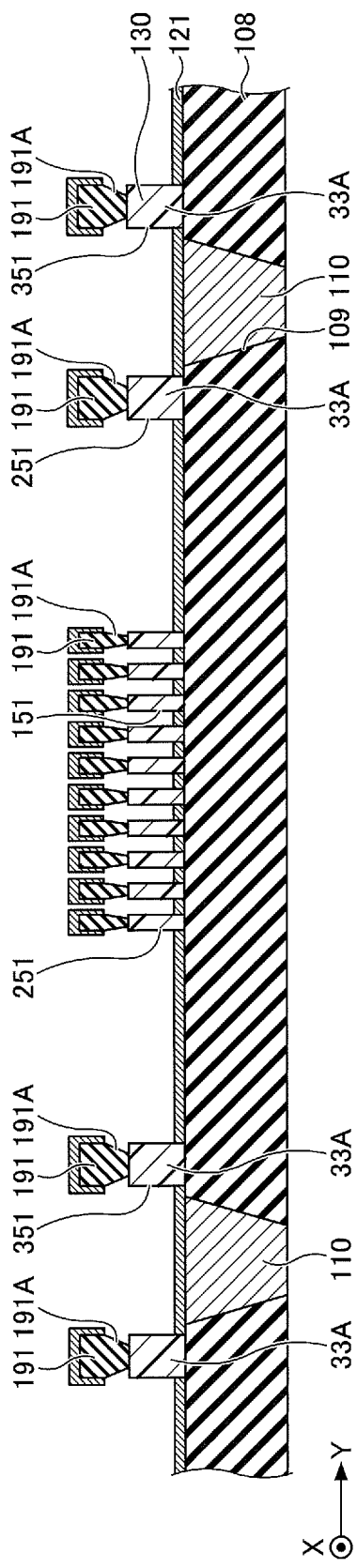
FIG. 13A and FIG. 13B are cross sectional views for explaining the method of manufacturing the wiring board according to the second embodiment.
Figure 13B:
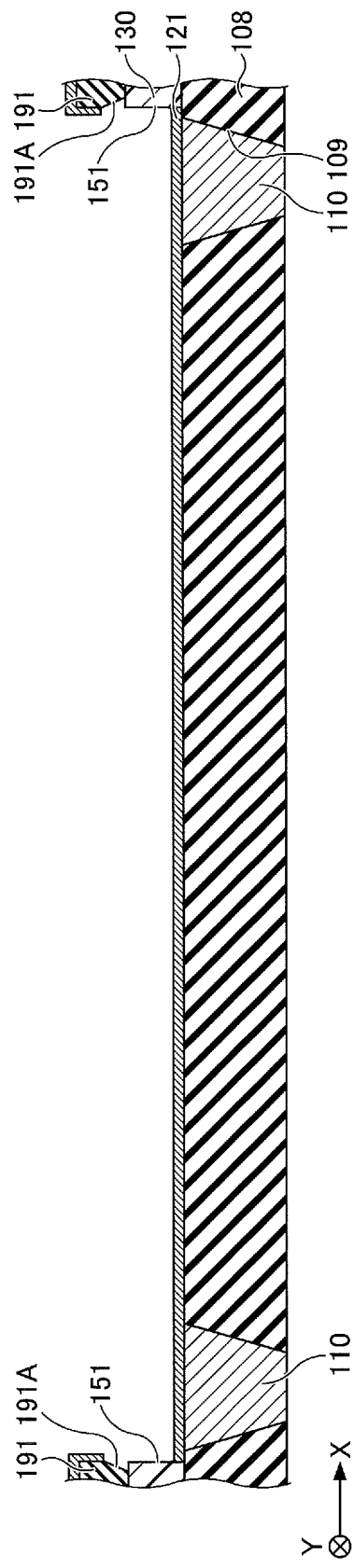

Thereafter, as illustrated in FIG. 13A and FIG. 13B, the seed layer 121 is formed within the micro-grooves 151 and the grooves 251 by sputtering. The seed layer 121 is formed on an upper surface and side surfaces of the photoresist layer 191, but is not formed on the constricted part 191A. For example, the titanium layer and the copper layer are successively formed when forming the seed layer 121.

Next, as illustrated in FIG. 14A and FIG. 14B, the photoresist layer 191 is removed together with the seed layer 121 that is formed on the upper surface and the side surfaces of the photoresist layer 191. As a result, an upper surface of each projecting part for separating the adjacent microgrooves 151 becomes flush with an upper surface of each projecting part 33A surrounded by the groove 251.

Then, as illustrated in FIG. 15A and FIG. 15B, the metal plated layer 122, made of copper or the like, is formed on the seed layer 121 by electroless plating. The micro-wirings 21A, the degassing holes 31A, and the anchor via pads 32A are formed in the first micro-wiring layer 51.

Thereafter, as illustrated in FIG. 16A and FIG. 16B, the fourth insulating layer 140, including the micro-via holes 130A above parts of the first micro-wiring layer 51, is formed on the first micro-wiring layer 51 and the third insulating layer 130. For example, the fourth insulating layer 140 may be formed by an insulating resin such as photosensitive epoxy resins or the like. For example, the micro-via holes 140A may be formed by photolithography.

Next, as illustrated in FIG. 17A and FIG. 17B, a photoresist layer 192, including an opening at a part where the second micro-wiring layer 52 is formed, is formed on the fourth insulating layer 140. The photoresist layer 192 includes a constricted part 192A near an interface between the photoresist layer 192 and the fourth insulating layer 140. For example, the photoresist layer 192 includes openings at parts where the micro-wirings 21B are formed and at parts where the anchor via pads 32B are formed, and covers parts where the degassing holes 31B are formed.

Then, the fourth insulating layer 140 is etched, using the photoresist layer 192 as a mask. As a result, the micro-grooves 152 are formed in the fourth insulating layer 140 at the line parts of the L/S pattern that includes a region where the micro-wirings 21B are formed. In addition, the grooves 252 are formed in the fourth insulating layer 140 in regions or the like where the anchor via pads 32B are formed.

Figure 18A:
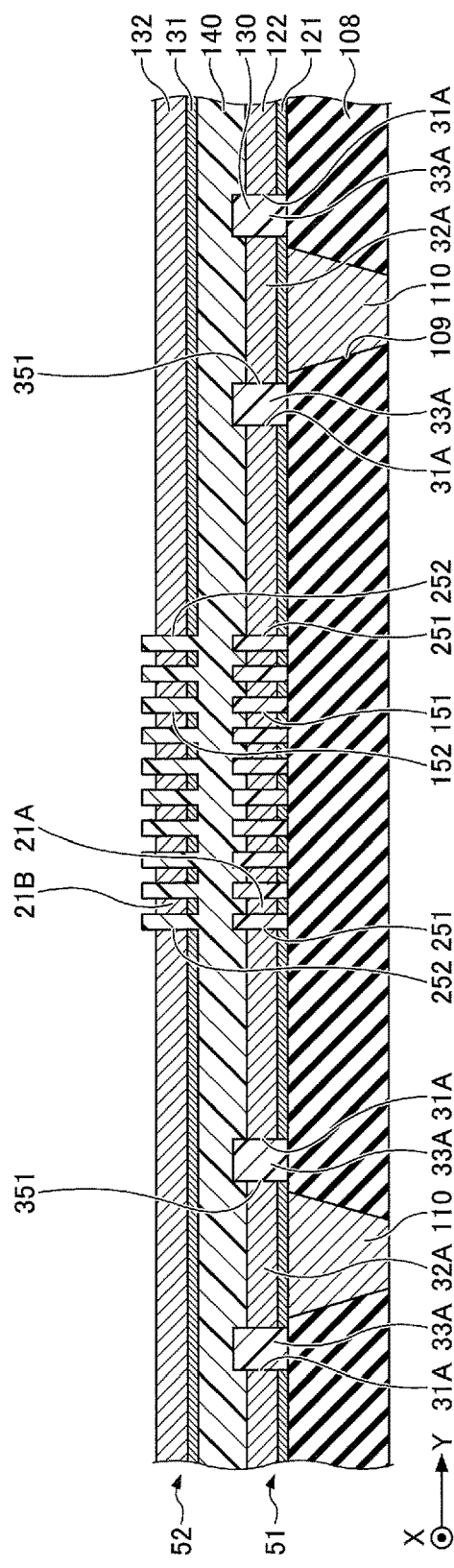
FIG. 18A and FIG. 18B are cross sectional views for explaining the method of manufacturing the wiring board according to the second embodiment.
Figure 18B:
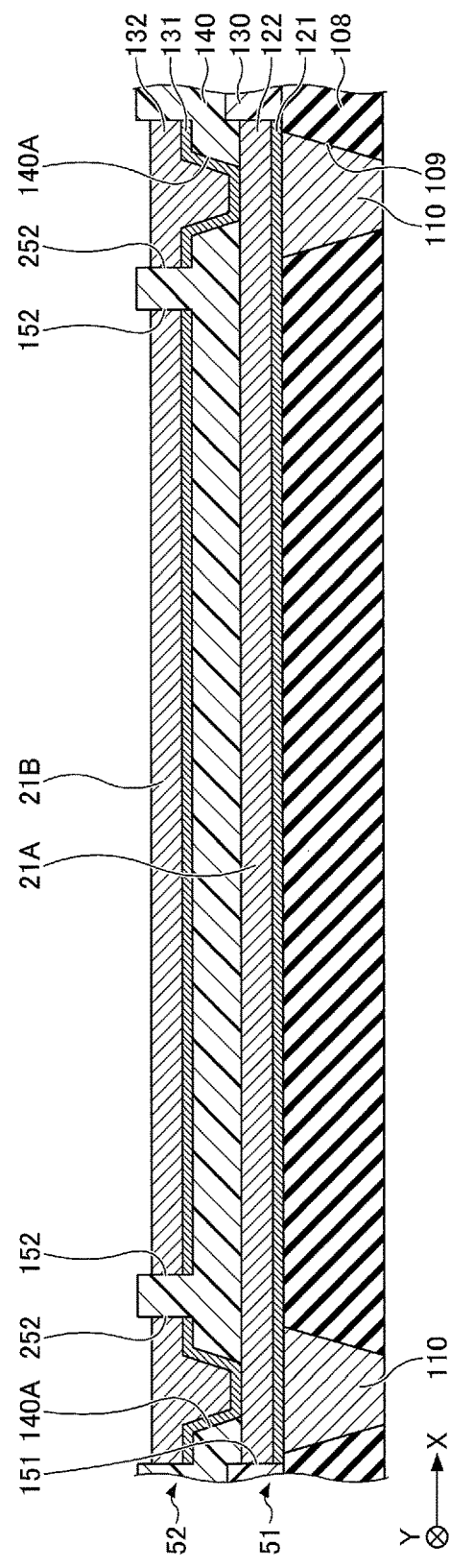

Thereafter, as illustrated in FIG. 18A and FIG. 18B, the seed layer 131 is formed within the micro-grooves 152 and the grooves 252 by sputtering. The seed layer 131 is formed on an upper surface and side surfaces of the photoresist layer 192, but is not formed on the constricted part 192A. Next, the photoresist layer 192 is removed together with the seed layer 131 that is formed on the upper surface and the side surfaces of the photoresist layer 192. Then, the metal plated layer 132, made of copper or the like, is formed on the seed layer 131 by electroless plating. The micro-wirings 21B, the degassing holes 31B, and the anchor via pads 32B are formed in the second micro-wiring layer 52, as illustrated in FIG. 2. Hence, an upper surface of each projecting part for separating the adjacent micro-grooves 152 becomes flush with an upper surface of each projecting part surrounded by the groove 252.

Next, as illustrated in FIG. 19A and FIG. 19B, the fifth insulating layer 150, including the micro-via holes 150A above parts of the second micro-wiring layer 52, is formed on the second micro-wiring layer 52 and the fourth insulating layer 140. For example, the fifth insulating layer 150 may be formed by an insulating resin such as photosensitive epoxy resins or the like. For example, the micro-via holes 150A may be formed by photolithography.

Then, as illustrated in FIG. 20A and FIG. 20B, a photoresist layer 193, including an opening at a part where the third micro-wiring layer 53 is formed, is formed on the fifth insulating layer 150. The photoresist layer 193 includes a constricted part 193A near an interface between the photoresist layer 193 and the fifth insulating layer 150. For example, the photoresist layer 193 includes openings at parts where the micro-wirings 21C are formed and at parts where the anchor via pads 32C are formed, and covers parts where the degassing holes 31C are formed.

Thereafter, the fifth insulating layer 150 is etched, using the photoresist layer 193 as a mask. As a result, the micro-grooves 153 are formed in the fifth insulating layer 150 at the line parts of the L/S pattern that includes a region where the micro-wirings 21C are formed. In addition, the grooves 253 are formed in the fifth insulating layer 150 in regions or the like where the anchor via pads 32C are formed.

Next, as illustrated in FIG. 21A and FIG. 21B, the seed layer 141 is formed within the micro-grooves 153 and the grooves 253 by sputtering. The seed layer 141 is formed on an upper surface and side surfaces of the photoresist layer 193, but is not formed on the constricted part 193A. Next, the photoresist layer 193 is removed together with the seed layer 141 that is formed on the upper surface and the side surfaces of the photoresist layer 193. Then, the metal plated layer 142, made of copper or the like, is formed on the seed layer 141 by electroless plating. The micro-wirings 21C, the degassing holes 31C, and the anchor via pads 32C are formed in the second micro-wiring layer 53. Hence, an upper surface of each projecting part for separating the adjacent micro-grooves 153 becomes flush with an upper surface of each projecting part 33C surrounded by the groove 253.

Next, as illustrated in FIG. 22A and FIG. 22B, the sixth insulating layer 160, including the micro-via holes 160A above parts of the third micro-wiring layer 53, is formed on the third micro-wiring layer 53 and the fifth insulating layer 150. For example, the sixth insulating layer 160 may be formed by an insulating resin such as photosensitive epoxy resins or the like. For example, the micro-via holes 160A may be formed by photolithography.

Then, the connection terminals 61 through 63, that electrically connect to the third micro-wiring layer 53 through the via conductor within the micro-via holes 160A, are formed on the sixth insulating layer 160. The connection terminals 61 through 64 may be famed by a semi-additive method, and respectively include the seed layer 161 and the metal plated layer 162.

Thereafter, the structure illustrated in FIG. 22A and FIG. 22B is cut along cutting lines (not illustrated) using a slicer or the like. Hence, the structure is cut into a plurality of pieces respectively corresponding to the wiring board 1, and a plurality of wiring boards 1 according to the first embodiment are obtained from the large core wiring board 101. The wiring board 1 according to the first embodiment can be manufactured by the processes described heretofore.

According to this manufacturing method, because the degassing holes 31A and the anchor via pads 32A are formed by forming the seed layer 121 and the metal plated layer 122 within the grooves 251, it is possible to reduce the ion migration in the first micro-wiring layer 51 without forming the grooves that may cause generation of voids. Because the degassing holes 31B and the anchor via pads 32B are formed by forming the seed layer 131 and the metal plated layer 132 within the grooves 252, it is possible to reduce the ion migration in the second micro-wiring layer 52 without forming the grooves that may cause generation of voids. In addition, because the degassing holes 31C and the anchor via pads 32C are formed by forming the seed layer 141 and the metal plated layer 142 within the grooves 253, it is possible to reduce the ion migration in the third micro-wiring layer 53 without forming the grooves that may cause generation of voids. Accordingly, it is possible to reduce the peeling of the layer caused by the void, and reduce the connection failure associated with the peeling.

[Modifications]

Figure 24A:
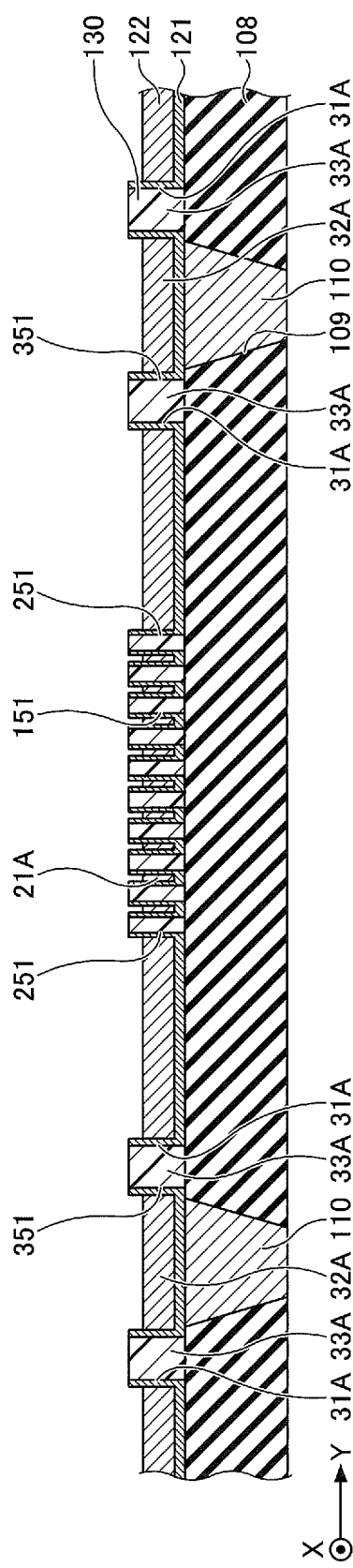
FIG. 24A and FIG. 24B are cross sectional views illustrating the modification of the second embodiment.
Figure 24B:
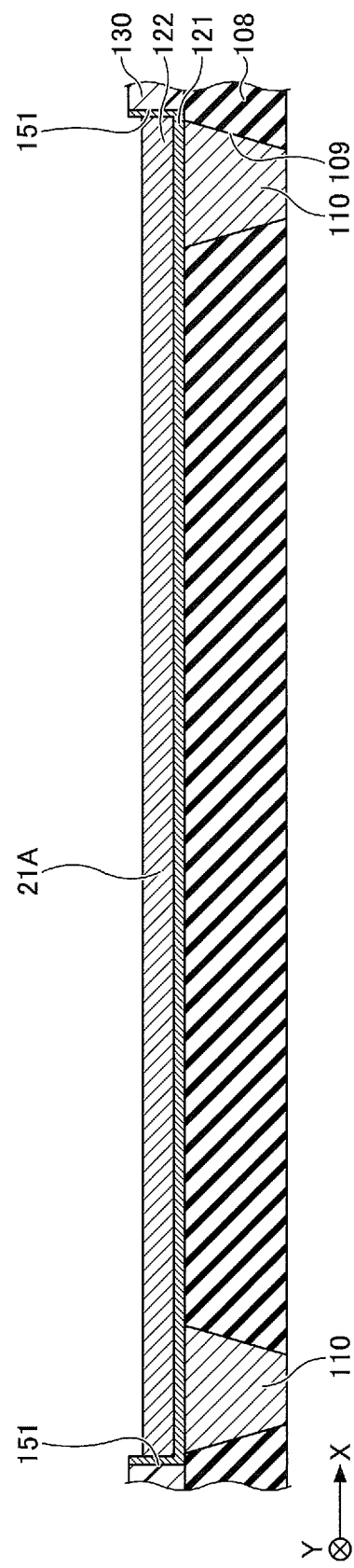

In a modification of the second embodiment, the seed layer 121 may be formed not only on bottom surfaces of the micro-grooves 151, the grooves 251, and the grooves 351, but also on side surfaces of the micro-grooves 151, the grooves 251, and the grooves 351, as illustrated in FIG. 23A and FIG. 23B. In this case, the processes up to forming the metal plated layer 122 are preferably performed as illustrated in FIG. 24A and FIG. 24B, and parts of the seed layer 121 located above the upper surface of the metal plate layer 122 are preferably removed as illustrated in FIG. 25A and FIG. 25B. In other words, processes are preferably performed so that the upper surface of the metal plated layer 122 is located below the upper surface of the third insulating layer 130, so as to more positively reduce the ion migration. Processes associated with the seed layers 131 and 141 may be performed similar to the processes associated with the seed layer 121.

Figure 26:
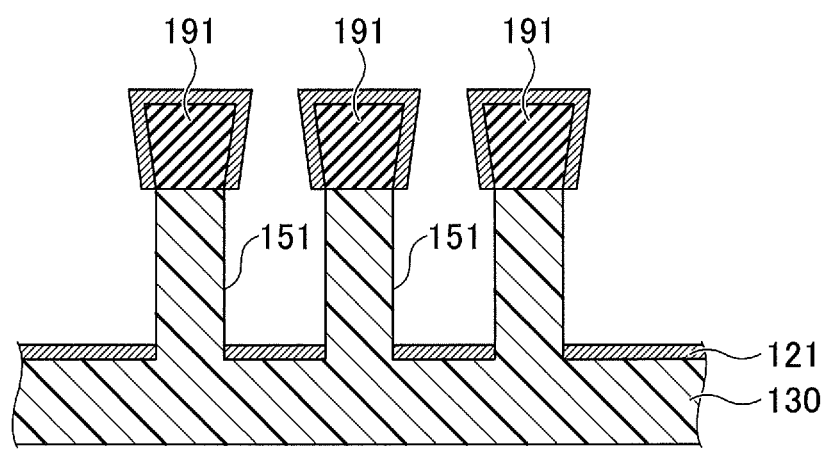
FIG. 26 is a cross sectional view illustrating another example of a photoresist layer.
Figure 27:
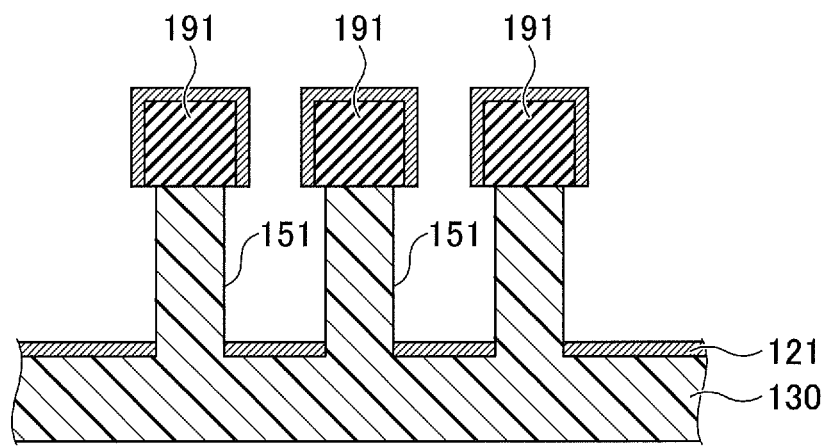
FIG. 27 is a cross sectional view illustrating still another example of the photoresist layer.

In addition, the cross sectional shape of the photoresist layer 191 is not particularly limited. For example, as illustrated in FIG. 26, the cross sectional shape of the photoresist layer 191 may be an inverted taper shape having a size that becomes smaller toward the third insulating layer 130. In this case, the side surfaces of the micro-grooves 151 are concealed by the upper surface of the photoresist layer 191, and thus, the seed layer 121 is uneasily formed on the side surfaces of the micro-grooves 151. Further, the cross sectional shape of the photoresist layer 191 may be a rectangular shape. In this case, it is preferable to select an etching condition such that the side surfaces of the micro-grooves 151 are concealed by the upper surface of the photoresist layer 191 when forming the micro-grooves 151. In a case where the seed layer 121 is formed on the side surfaces of the micro-grooves 151, it is preferable to remove the parts of the photoresist layer 191 located above the upper surface of the metal plated layer 122 after forming the metal plated layer 122, as described above. Processes associated with the photoresist layers 192 and 193 may be performed similar to the processes associated with the photoresist layer 191.

Therefore, according to each of the embodiments and modifications described above, it is possible to reduce the connection failure.

Although examples of preferable embodiments are described heretofore, the present invention is not limited to these embodiments, and various variations, modifications, and substitutions may be made without departing from the scope of the present invention. For example, although the described embodiments use the buildup substrate, it is of course possible to use a support substrate or a support base in place of the buildup substrate.

Various aspects of the subject-matter described herein may be set out non-exhaustively in the following numbered clauses:

1. A method of manufacturing a wiring board, comprising:
    forming, in an insulating layer, a first pattern that includes a plurality of first grooves extending parallel to each other, and a second pattern that includes a second groove surrounding a projecting part; and
    forming a metal layer within the plurality of first grooves and the second groove, to form a plurality of wirings extending parallel to each other within the first pattern, and a degassing hole within the second pattern and having an opening formed by the projecting part.

2. The method of manufacturing the wiring board according to clause 1, wherein the plurality of first grooves are formed by a line-and-space pattern.

3. The method of manufacturing the wiring board according to clause 1 or 2, wherein the forming the metal layer faults the metal layer so that an upper surface of the metal layer is located below an upper surface of the insulating layer.

4. The method of manufacturing the wiring board according to any one of clauses 1 to 3, wherein the degassing hole has a circular planar shape.

5. The method of manufacturing the wiring board according to any one of clauses 1 to 4, wherein
    the forming the first pattern and the second pattern forms a third groove inside the projecting part, and
    the forming the plurality of wirings and the degassing hole forms a pad within the third groove, by also forming the metal layer within the third groove.

6. The method of manufacturing the wiring board according to any one of clauses 1 to 5, wherein the forming the first pattern and the second pattern forms the projecting part, separating adjacent first grooves, between adjacent wirings.

Although the embodiments are numbered with, for example, "first," or "second," the ordinal numbers do not imply priorities of the embodiments. Many other variations and modifications will be apparent to those skilled in the art.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A wiring board comprising:
    an insulating layer that includes a first pattern and a second pattern, the first pattern including a plurality of first grooves extending parallel to each other, and a first projecting part separating adjacent first grooves, the second pattern including a second projecting part, and a second groove surrounding the second projecting part; and
    a metal layer that includes a wiring formed within the plurality of first grooves, and a degassing hole formed within the second pattern and having an opening formed by the second projecting part,
    wherein the metal layer includes a seed layer, and a metal plated layer formed on the seed layer, and
    wherein the seed layer makes contact with bottom surfaces of the plurality of first grooves.

2. The wiring board as claimed in claim 1, wherein the plurality of first grooves are formed in a line-and-space pattern.

3. The wiring board as claimed in claim 1, wherein an upper surface of the metal layer is located below an upper surface of the insulating layer.

4. The wiring board as claimed in claim 1, wherein the degassing hole has a circular planar shape.

5. The wiring board as claimed in claim 1, wherein
    the insulating layer further includes a third groove surrounded by the second projecting part, and
    the metal layer further includes an anchor via pad provided in the third groove.

6. The wiring board as claimed in claim 1, wherein an upper surface of the first projecting part is co-planar with an upper surface of the second projecting part.

7. The wiring board as claimed in claim 1, wherein the seed layer further makes contact with side surfaces of the plurality of first grooves.

8. The wiring board as claimed in claim 1, wherein the second groove and the degassing hole are separate from each other.

9. The wiring board as claimed in claim 1, wherein the seed layer further makes contact with a bottom surface of the degassing hole.

10. The wiring board as claimed in claim 9, wherein the seed layer further makes contact with a side surface of the degassing hole.

11. The wiring board as claimed in claim 1, wherein the second groove, in a plan view viewed in a direction perpendicular to an upper surface of the metal layer, is arranged between a first region provided with the first pattern, and a second region provided with the degassing hole.

12. The wiring board as claimed in claim 1, wherein the seed layer is a metal laminate.

13. The wiring board as claimed in claim 1, further comprising: a first pair, a second pair, and a third pair, respectively including the insulating layer and the metal layer, and are successively laminated along a thickness direction of the wiring board, wherein the degassing hole of the first pair, and the degassing hole of the second pair adjacent to the first pair along the thickness direction, are separated from each other in a plan view viewed in a direction perpendicular to an upper surface of the metal layer, and wherein the degassing hole of the first pair, and the degassing hole of the third pair not adjacent to the first pair along the thickness direction, overlap each other in the plan view.

* * * * *